United States Patent
Huang

(10) Patent No.: US 11,817,386 B2
(45) Date of Patent: Nov. 14, 2023

(54) METHOD FOR PREPARING VERTICAL ELECTRICAL FUSE DEVICE

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 126 days.

(21) Appl. No.: 17/508,770

(22) Filed: Oct. 22, 2021

(65) Prior Publication Data

US 2022/0045002 A1    Feb. 10, 2022

Related U.S. Application Data

(62) Division of application No. 16/922,628, filed on Jul. 7, 2020, now Pat. No. 11,469,176.

(51) Int. Cl.
*H01L 23/525* (2006.01)
*H10B 20/20* (2023.01)

(52) U.S. Cl.
CPC ......... *H01L 23/5256* (2013.01); *H10B 20/20* (2023.02)

(58) Field of Classification Search
CPC ............. H01L 23/525–5258; H10B 20/20–25
See application file for complete search history.

(56) References Cited

U.S. PATENT DOCUMENTS

| 10,438,956 B2 | 10/2019 | Balakrishnan et al. |
| 2009/0026574 A1 | 1/2009 | Kim et al. |
| 2009/0051002 A1 | 2/2009 | Booth, Jr. et al. |
| 2017/0345829 A1* | 11/2017 | Balakrishnan .... H01L 21/76224 |
| 2018/0122913 A1 | 5/2018 | Xie et al. |
| 2018/0226343 A1* | 8/2018 | Cheng ................. H01L 23/5256 |
| 2020/0111741 A1 | 4/2020 | Yang et al. |
| 2020/0219812 A1 | 7/2020 | Yang |

FOREIGN PATENT DOCUMENTS

TW    201214654 A    4/2012

OTHER PUBLICATIONS

Office Action dated Mar. 31, 2022 related to U.S. Appl. No. 16/922,628, wherein this application is a DIV of U.S. Appl. No. 16/922,628.

* cited by examiner

*Primary Examiner* — Laura M Menz
*Assistant Examiner* — Candice Chan
(74) *Attorney, Agent, or Firm* — Xuan Zhang

(57) ABSTRACT

The present disclosure relates to a method for preparing an electrical fuse (e-fuse) device. The method includes forming a mask layer over a semiconductor substrate, and etching the semiconductor substrate by using the mask layer as a mask to form a fuse link over a semiconductor base. The method also includes epitaxially growing a first bottom anode/cathode region and a second bottom anode/cathode region over the semiconductor base and adjacent to a bottom portion of the fuse link. The fuse link is between the first bottom anode/cathode region and the second anode/cathode region. The method further includes epitaxially growing a top anode/cathode region to replace the mask layer.

5 Claims, 21 Drawing Sheets

METHOD FOR PREPARING VERTICAL ELECTRICAL FUSE DEVICE

CROSS-REFERENCE TO RELATED APPLICATION

This application is a divisional application of U.S. Non-Provisional Application Ser. No. 16/922,628 filed Jul. 7, 2020, which is incorporated herein by reference in its entirety.

TECHNICAL FIELD

The present disclosure relates to a method for preparing an electrical fuse (e-fuse) device, and more particularly, to a method for preparing a vertical electrical fuse (e-fuse) device.

DISCUSSION OF THE BACKGROUND

Integrated circuit (IC) devices are usually made with all internal connections set during the manufacturing process. However, due to high development costs, long manufacturing times, and high manufacturing tooling costs for forming such IC devices, users often desire circuits which can be configured or programmed in the field. Such circuits are called programmable circuits and they usually contain programmable links. Programmable links are electrical interconnects which are either broken or created at selected electronic nodes by the user after the IC device has been fabricated and packaged in order to activate or deactivate respective selected electronic nodes.

One type of the programmable links is an electrical fuse (e-fuse) device. E-fuse devices are utilized in semiconductor integrated circuits for various applications including, for example, memory array redundancy, post-manufacture programming of circuits, and package identification coding. However, the fabrication of e-fuse devices using conventional complementary metal-oxide-semiconductor (CMOS) technologies requires multiple deposition and masking steps, which is costly and time consuming. Therefore, the complexity of processing steps that are incorporated to fabricate integrated e-fuse devices should be reduced to lower the costs and time for constructing IC devices with e-fuses. Moreover, the footprint area occupied by the e-fuse devices should be minimized.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a vertical e-fuse device is provided. The vertical e-fuse device includes a fuse link disposed over a semiconductor base. A material of the fuse link and a material of the semiconductor base are the same. The vertical e-fuse device also includes a first bottom anode/cathode region and a second bottom anode/cathode region disposed over the semiconductor base. A bottom portion of the fuse link is sandwiched between the first bottom anode/cathode region and the second anode/cathode region. The vertical e-fuse device further includes a top anode/cathode region disposed over the fuse link.

In an embodiment, the top anode/cathode region includes a faceted portion. In an embodiment, the fuse link is doped with an n-type dopant. In an embodiment, the fuse link and the top anode/cathode region are annular shaped from a top view. In an embodiment, the vertical e-fuse device further includes a silicide layer disposed over the first bottom anode/cathode region, and a bottom spacer layer disposed over the silicide layer, wherein the silicide layer is separated from the fuse link by the bottom spacer layer.

In an embodiment, the vertical e-fuse device further includes a first fuse dielectric layer disposed over the first bottom anode/cathode region, and a second fuse dielectric layer disposed over the second bottom anode/cathode region, wherein the first bottom anode/cathode region and the first fuse dielectric layer are in direct contact with a first sidewall of the fuse link, and the second bottom anode/cathode region and the second fuse dielectric layer are in direct contact with a second sidewall of the fuse link. In an embodiment, the vertical e-fuse device further includes a first conductive layer disposed over the first fuse dielectric layer, wherein the first conductive layer is separated from the fuse link by the first fuse dielectric layer, and a second conductive layer disposed over the second fuse dielectric layer, wherein the second conductive layer is separated from the fuse link by the second fuse dielectric layer.

In another embodiment of the present disclosure, a vertical e-fuse device is provided. The vertical e-fuse device includes an annular fuse link disposed over a semiconductor base. A material of the annular fuse link and a material of the semiconductor base are the same. The vertical e-fuse device also includes a first bottom anode/cathode region surrounded by a bottom portion of the annular fuse link, and a second bottom anode/cathode region surrounding the bottom portion of the annular fuse link. The vertical e-fuse device further includes a top anode/cathode region disposed over the annular fuse link.

In an embodiment, the top anode/cathode region is annular, and the top anode/cathode region is in direct contact with a top surface of the annular fuse link. In an embodiment, the first bottom anode/cathode region adjoins an inner sidewall of the annular fuse link, and the second bottom anode/cathode region adjoins an outer sidewall of the annular fuse link. In an embodiment, the vertical e-fuse device further includes a first silicide layer disposed over the first bottom anode/cathode region, and a second silicide layer disposed over the second bottom anode/cathode region, wherein the first silicide layer and the second silicide layer are separated from the annular fuse link. In an embodiment, the vertical e-fuse device further includes a first fuse dielectric layer disposed on an inner sidewall of the annular fuse link and a second fuse dielectric layer disposed on an outer sidewall of the annular fuse link, wherein the first fuse dielectric layer extends over the first bottom anode/cathode region, and the second fuse dielectric layer extends over the second bottom anode/cathode region.

In an embodiment, the vertical e-fuse device further includes a first conductive layer disposed over the first fuse dielectric layer, and a second conductive layer disposed over the second fuse dielectric layer, wherein the first conductive layer and the second conductive layer are separated from the annular fuse link. In an embodiment, the vertical e-fuse device further includes a bottom spacer layer disposed between the first bottom anode/cathode region and the first fuse dielectric layer and between the second bottom anode/cathode region and the second fuse dielectric layer, and a top spacer layer covering the first fuse dielectric layer, the first conductive layer, the second fuse dielectric layer, and the second conductive layer.

In yet another embodiment of the present disclosure, a method for preparing a vertical e-fuse device is provided. The method includes forming a mask layer over a semiconductor substrate, and etching the semiconductor substrate by using the mask layer as a mask to form a fuse link over a semiconductor base. The method also includes epitaxially growing a first bottom anode/cathode region and a second bottom anode/cathode region over the semiconductor base and adjacent to a bottom portion of the fuse link. The fuse link is between the first bottom anode/cathode region and the second anode/cathode region. The method further includes epitaxially growing a top anode/cathode region to replace the mask layer.

In an embodiment, the mask layer and the fuse link have overlapped annular shapes from a top view. In an embodiment, the formation of the mask layer further includes forming a ring structure over the semiconductor substrate, and forming a mask material to cover a portion of the semiconductor substrate exposed by the ring structure. In addition, the formation of the mask layer includes depositing an inner spacer layer and an outer spacer layer over the mask material, wherein an inner sidewall of the ring structure is covered by the inner spacer layer, and an outer sidewall of the ring structure is covered by the outer spacer layer, and etching the mask material by using the inner spacer layer and the outer spacer layer as a mask to form the mask layer over the semiconductor substrate.

In an embodiment, the method further includes implanting the fuse link with an n-type dopant, and removing the inner spacer layer and the outer spacer layer after the implantation of the fuse link. In an embodiment, the method further includes forming a first silicide layer over the first bottom anode/cathode region and a second silicide layer over the second bottom anode/cathode region, and forming a bottom spacer layer to cover the first silicide layer and the second silicide layer before the top anode/cathode region is grown. In an embodiment, the method further includes forming a first fuse dielectric layer and a second fuse dielectric layer over the bottom spacer layer and on opposite sidewalls of the fuse link, and forming a first conductive layer over the first fuse dielectric layer and a second conductive layer over the second fuse dielectric layer. In addition, the method includes forming a top spacer layer to cover the first conductive layer and the second conductive layer before the top anode/cathode region is grown.

Embodiments of a vertical e-fuse device are provided in the disclosure. The vertical e-fuse device includes a fuse link and bottom anode/cathode regions disposed over a semiconductor base, and a bottom portion of the fuse link is sandwiched between the bottom anode/cathode regions. The vertical e-fuse device also includes a top anode/cathode region disposed over the fuse link. Since the fuse link is arranged in the vertical direction between the bottom anode/cathode regions and the top anode/cathode region, the vertical e-fuse device can be integrated with other semiconductor devices, such as a fin field effect transistor (FinFET) device, and the vertical e-fuse device can be integrally formed with the FinFET device without additional process steps.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 14 illustrates an intermediate stage of epitaxially growing bottom anode/cathode regions over the semiconductor base during the formation of the vertical e-fuse device, in accordance with some embodiments.

FIG. 15 illustrates an intermediate stage of forming inner spacer layers and outer spacer layers during the formation of the vertical e-fuse device, in accordance with some embodiments.

FIG. 16 illustrates an intermediate stage of forming silicide layers over the bottom anode/cathode regions during the formation of the vertical e-fuse device, in accordance with some embodiments.

FIG. 18 illustrates an intermediate stage of forming fuse dielectric layers and conductive layers over the bottom spacer layer during the formation of the vertical e-fuse device, in accordance with some embodiments.

FIG. 19 illustrates an intermediate stage of forming a top spacer layer over the fuse dielectric layers and the conductive layers during the formation of the vertical e-fuse device, in accordance with some embodiments.

FIG. 20 illustrates an intermediate stage of forming dielectric layers penetrating through the conductive layers during the formation of the vertical e-fuse device, in accordance with some embodiments.

FIG. 21 illustrates an intermediate stage of epitaxially growing a top anode/cathode region to replace the mask layer during the formation of the vertical e-fuse device, in accordance with some embodiments.

DETAILED DESCRIPTION

Figure 1:
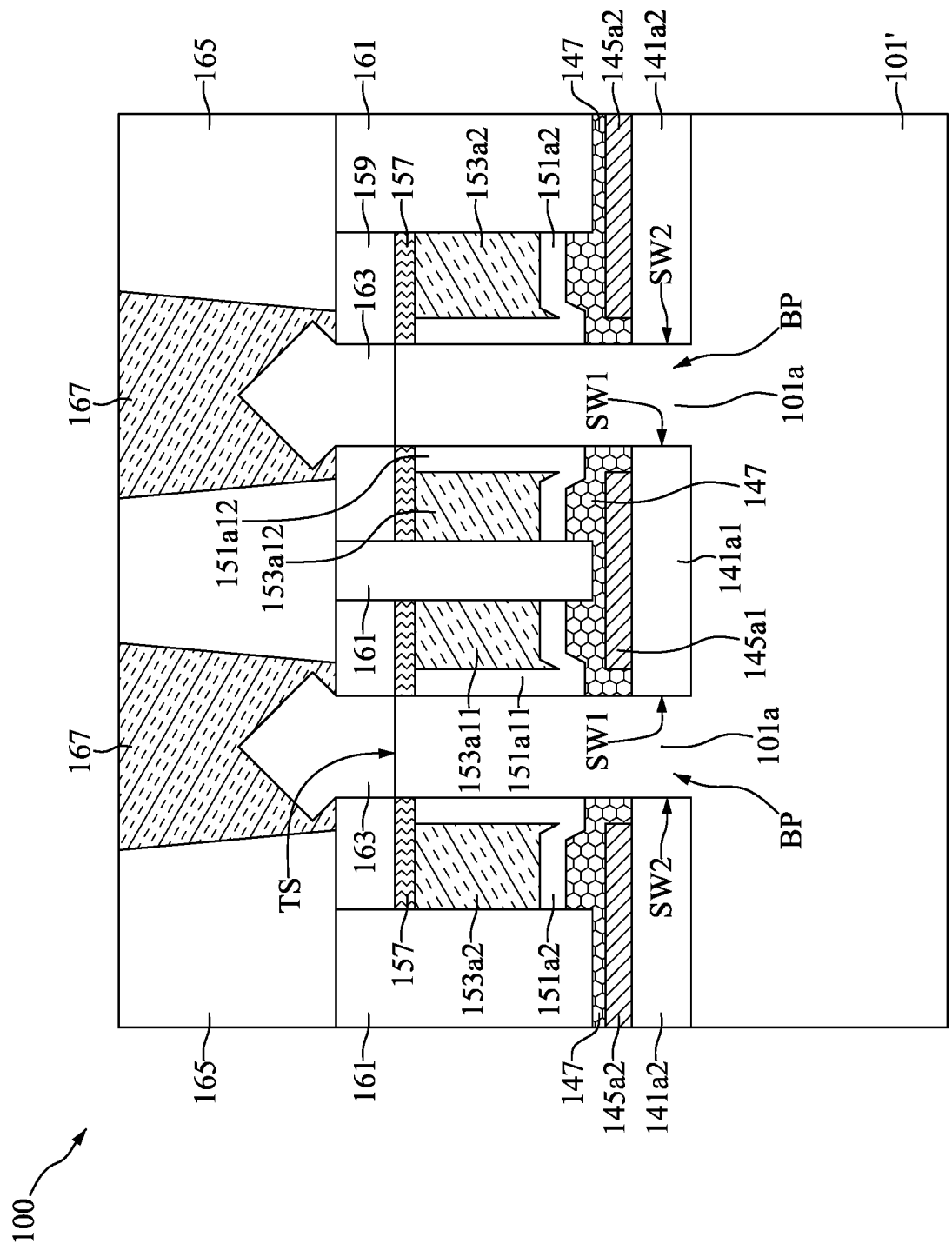
FIG. 1 is a cross-sectional view illustrating a vertical e-fuse device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a vertical e-fuse device 100, in accordance with some embodiments. As shown in FIG. 1, the vertical e-fuse device 100 includes a fuse link 101a and bottom anode/cathode regions 141a1, 141a2 disposed over a semiconductor base 101', and a top anode/cathode region 163 disposed over the fuse link 101a.

In some embodiments, the two segments of the fuse link 101a shown in FIG. 1 are physically connected together since the two segments are different parts of a continuous annular structure, which will be described in more detail later. The fuse link 101a is also referred to as an annular fuse link. In this case, the bottom anode/cathode region 141a1 is surrounded by a bottom portion BP of the fuse link 101a, and the two segments of the bottom anode/cathode region 141a2 shown in FIG. 1 are two different parts of a continuous annular structure surrounding the bottom portion BP of the fuse link 101a.

In some embodiments, the bottom portion BP of the fuse link 101a is sandwiched between the bottom anode/cathode regions 141a1 and 141a2. Specifically, the bottom anode/cathode region 141a1 adjoins the sidewall SW1 of the fuse link 101a, and the bottom anode/cathode region 141a2 adjoins the sidewall SW2 of the fuse link 101a. The sidewall SW1 is also referred to as the inner sidewall of the fuse link 101a. The sidewall SW2 is also referred to as the outer sidewall of the fuse link 101a. Similarly, the two segments of the top anode/cathode region 163 shown in FIG. 1 may be two different parts of a continuous annular structure. In some embodiments, the top anode/cathode region 163 is in direct contact with the top surface TS of the fuse link 101a.

Moreover, the vertical e-fuse device 100 includes silicide layers 145a1, 145a2 disposed over the bottom anode/cathode regions 141a1, 141a2, and a bottom spacer layer 147 covering the silicide layers 145a1, 145a2. In some embodiments, the silicide layer 145a1 is disposed over the bottom anode/cathode region 141a1, and the two segments of the silicide layer 145a2 shown in FIG. 1 are two different parts of a continuous annular structure disposed over the bottom anode/cathode region 141a2, which is also a continuous annular structure. In some embodiments, the silicide layers 145a1 and 145a2 are conformally covered by the bottom spacer layer 147, and the silicide layers 145a1 and 145a2 are separated from the sidewalls SW1 and SW2 of the fuse link 101a by the bottom spacer layer 147.

Still referring to FIG. 1, the vertical e-fuse device 100 includes fuse dielectric layers 151a11, 151a12, 151a2 disposed over the bottom spacer layer 147, and conductive layers 153a11, 153a12, 153a2 disposed over the fuse dielectric layers 151a11, 151a12, 151a2. In some embodiments, the fuse dielectric layers 151a11 and 151a12 are disposed on the sidewalls SW1 of the fuse link 101a, and the fuse dielectric layers 151a11 and 151a12 extends onto the portion of the bottom spacer layer 147 surrounded by the fuse link 101a. In some embodiments, the two segments of the fuse dielectric layer 151a2 shown in FIG. 1 are physically connected together and are disposed on the sidewall SW2 of the fuse link 101a, and the fuse dielectric layer 151a2 extends onto the portion of the bottom spacer layer 147 surrounding the fuse link 101a.

Similar to the fuse dielectric layer 151a2, the two segments of the conductive layer 153a2 are physically connected together since they are two different parts of a continuous annular structure, in accordance with some embodiments. In some embodiments, the conductive layers 153a11, 153a12, and 153a2 are separated from the fuse link 101a and the bottom spacer layer 147 by the fuse dielectric layers 151a11, 151a12, and 151a2.

In addition, the vertical e-fuse device 100 includes a top spacer layer 157 covering the conductive layers 153a11, 153a12, 153a2, an interlayer dielectric (ILD) layer 159 disposed over the top spacer layer 157 and surrounding the top anode/cathode region 163, and a dielectric layer 161 penetrating through the ILD layer 159 and the top spacer layer 157. In some embodiments, the fuse dielectric layer 151a11 and the conductive layer 153a11 are separated from the fuse dielectric layer 151a12 and the conductive layer 153a12 by the dielectric layer 161. In some embodiments, the dielectric layer 161 does not extend into the silicide layers 145a1 and 145a2. In other words, a portion of the bottom spacer layer 147 is sandwiched between the dielectric layer 161 and the silicide layers 145a1 and 145a2.

Furthermore, the vertical e-fuse device 100 includes a conductive contact 167 disposed over the top anode/cathode region 163, and another ILD layer 165 disposed over the dielectric layer 161 and the ILD layer 159 and surrounding the conductive contact 167. In some embodiments, the two segments of the conductive contact 167 shown in FIG. 1 are physically connected together since the two segments are different parts of a continuous annular structure. In some embodiments, the conductive contact 167 is electrically connected to the top anode/cathode region 163.

Figure 2:
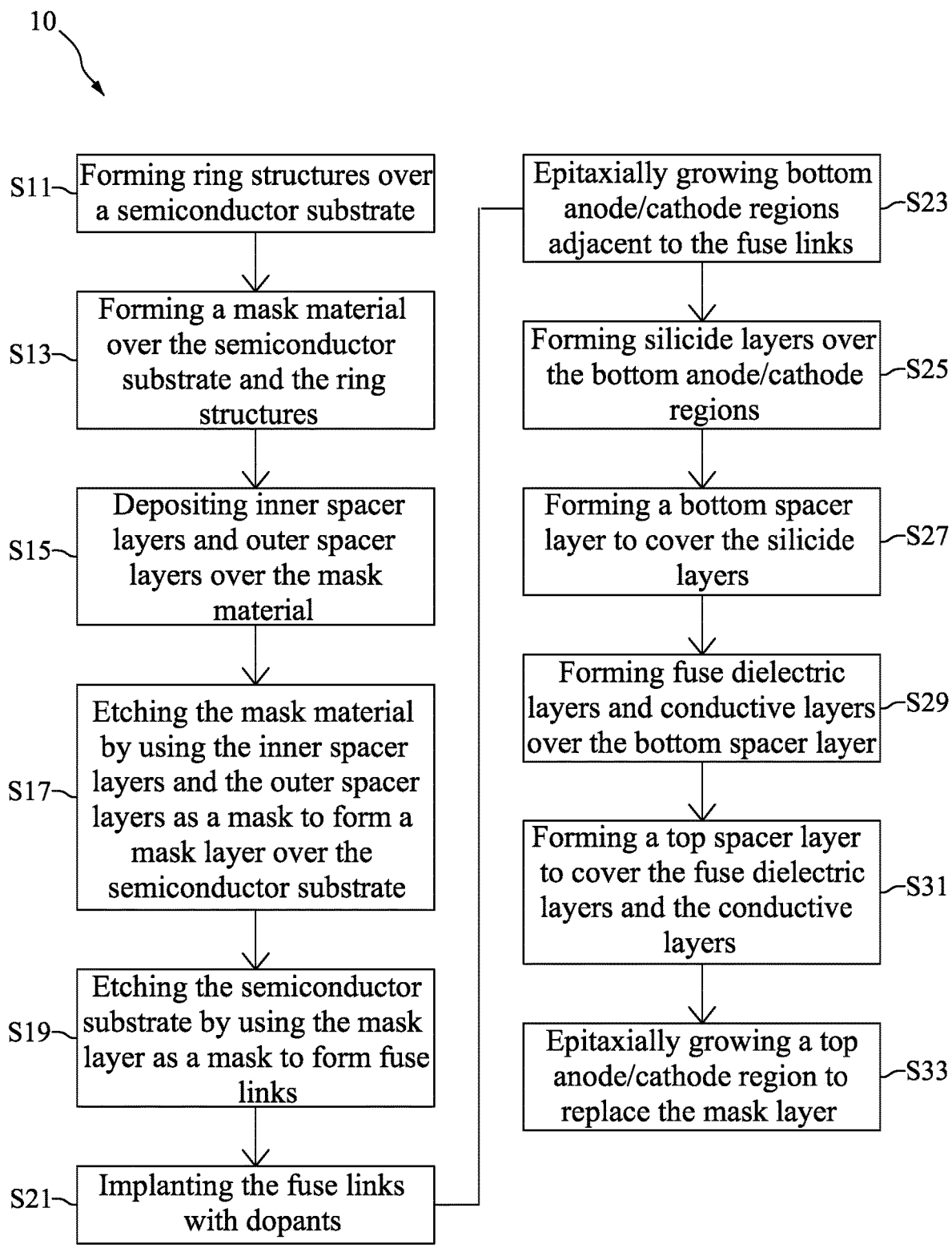
FIG. 2 is a flow diagram illustrating a method of forming a vertical e-fuse device, in accordance with some embodiments.

FIG. 2 is a flow diagram illustrating a method 10 of forming the vertical e-fuse device 100, and the method 10 includes steps S11, S13, S15, S17, S19, S21, S23, S25, S27, S29, S31 and S33, in accordance with some embodiments. The steps S11 to S33 of the method 10 are elaborated in connection with the following figures.

FIGS. 3, 5, 7, 9 and 12 are top views illustrating intermediate stages in the formation of the vertical e-fuse device 100, and FIGS. 4, 6, 8, 10, 11 and 13 are cross-sectional views illustrating intermediate stages in the formation of the vertical e-fuse device 100, in accordance with some embodiments. It should be noted that FIGS. 4, 6, 8, 10 and 13 are cross-sectional views along the sectional line I-I' of FIGS. 3, 5, 7, 9 and 12, respectively.

Figure 3:
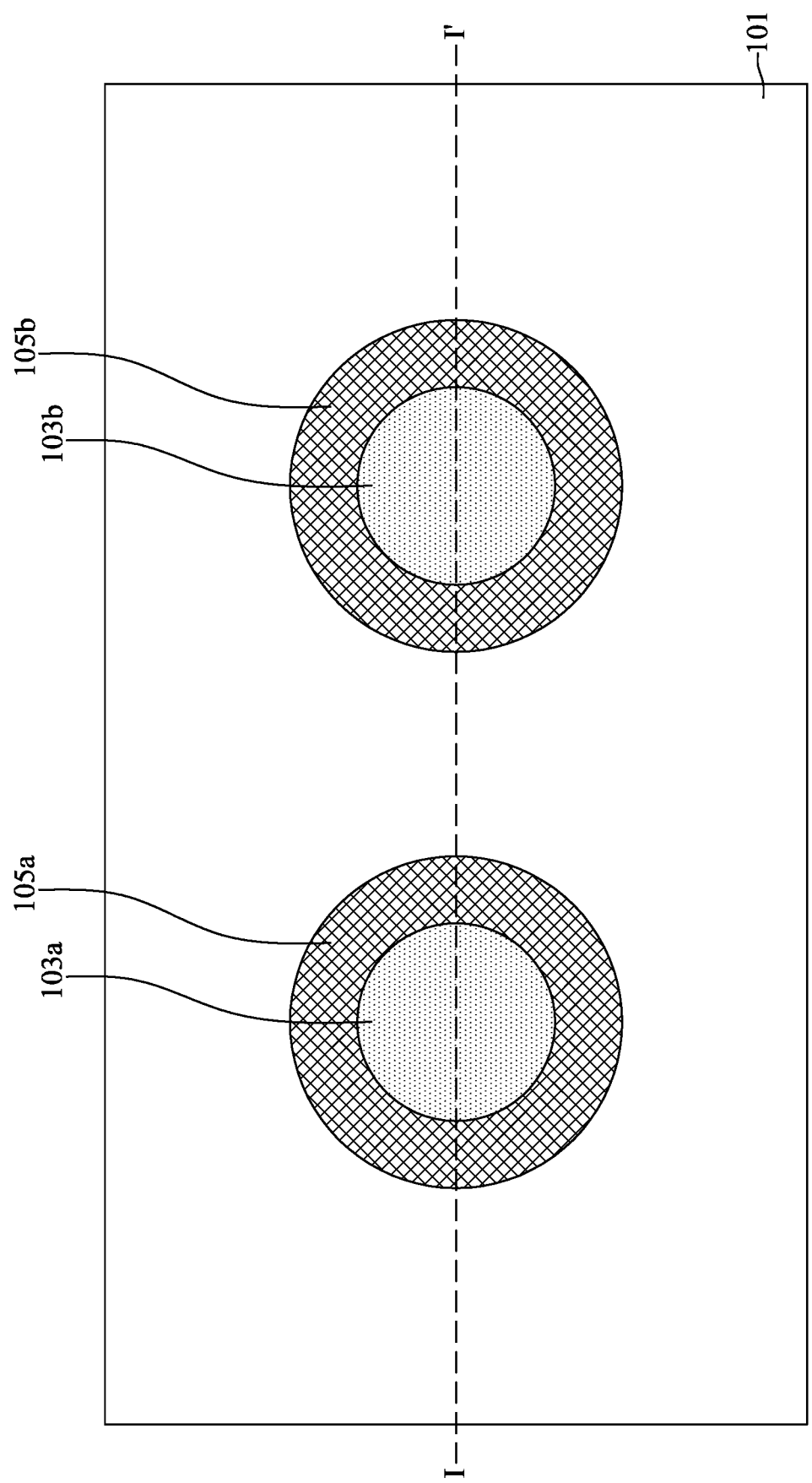
FIG. 3 is a top view illustrating an intermediate stage of forming ring structures over a semiconductor substrate during the formation of the vertical e-fuse device, in accordance with some embodiments.
Figure 4:
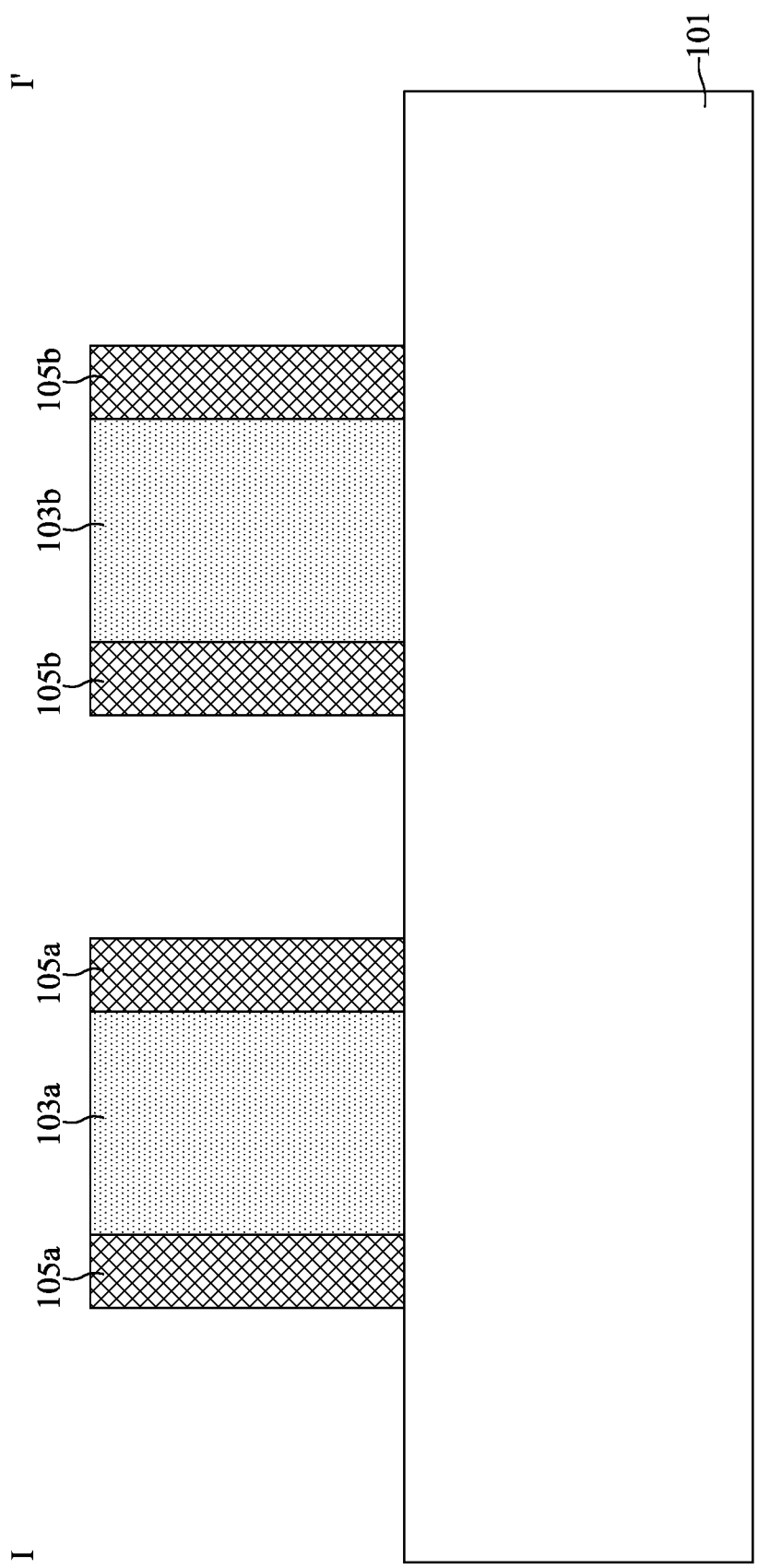
FIG. 4 is a cross-sectional view illustrating an intermediate stage of forming ring structures over a semiconductor substrate during the formation of the vertical e-fuse device along the sectional line I-I' in FIG. 3, in accordance with some embodiments.

As shown in FIGS. 3 and 4, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIGS. 3 and 4, cylindrical structures 103a and 103b are formed over the semiconductor substrate 101, and ring structures 105a and 105b are formed surrounding the cylindrical structures 103a and 103b, respectively, in accordance with some embodiment. The respective step is illustrated as the step S11 in the method 10 shown in FIG. 2. Although only two cylindrical structures and two ring structures are illustrated, it is understood that more than two cylindrical structures and two ring structures may be implemented in the vertical e-fuse device 100.

In some embodiments, the materials of the cylindrical structures 103a and 103b include silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. Moreover, the cylindrical structures 103a and 103b may be formed by a deposition process and a patterning process. For example, a material layer (not shown) may be deposited over the semiconductor substrate 101, and the material layer may be patterned to form the cylindrical structures 103a and 103b.

The deposition process may include a chemical vapor deposition (CVD) process, a physical vapor deposition (PVD) process, an atomic layer deposition (ALD) process, a spin-on coating process, another applicable process, or a combination thereof. The patterning process may include a photolithography processes and a subsequent etching process. The photolithography process may form photoresist patterns (not shown) on a top surface of the material layer. The photolithography process may include photoresist coating (e.g. spin-on coating), soft baking, mask aligning, exposure, post-exposure baking, developing the photoresist, rinsing and drying (e.g. hard baking). The etching process may be a dry etching process, a wet etching process, or a combination thereof.

In some embodiments, the sidewalls of the cylindrical structures 103a and 103b are entirely surrounded and in direct contact with the ring structure 105a and 105b, respectively. Some materials and processes used to form the ring structures 105a and 105b are similar to, or the same as, those used to form the cylindrical structures 103a and 103b, and details thereof are not repeated herein. However, it should be noted that the materials of the ring structures 105a and 105b are different from the materials of the cylindrical structures 103a and 103b.

Figure 5:
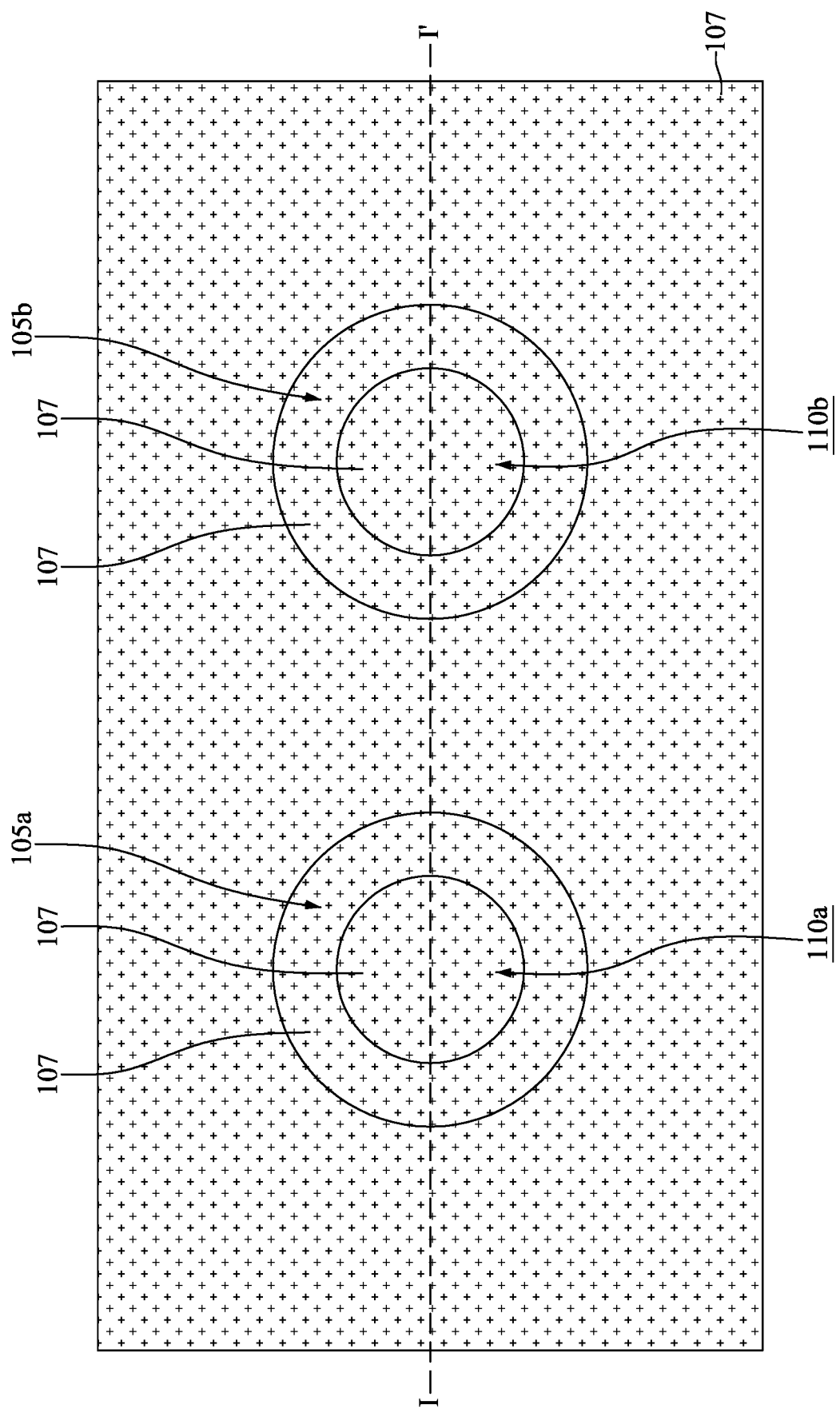
FIG. 5 is a top view illustrating an intermediate stage of forming a mask material during the formation of the vertical e-fuse device, in accordance with some embodiments.
Figure 6:
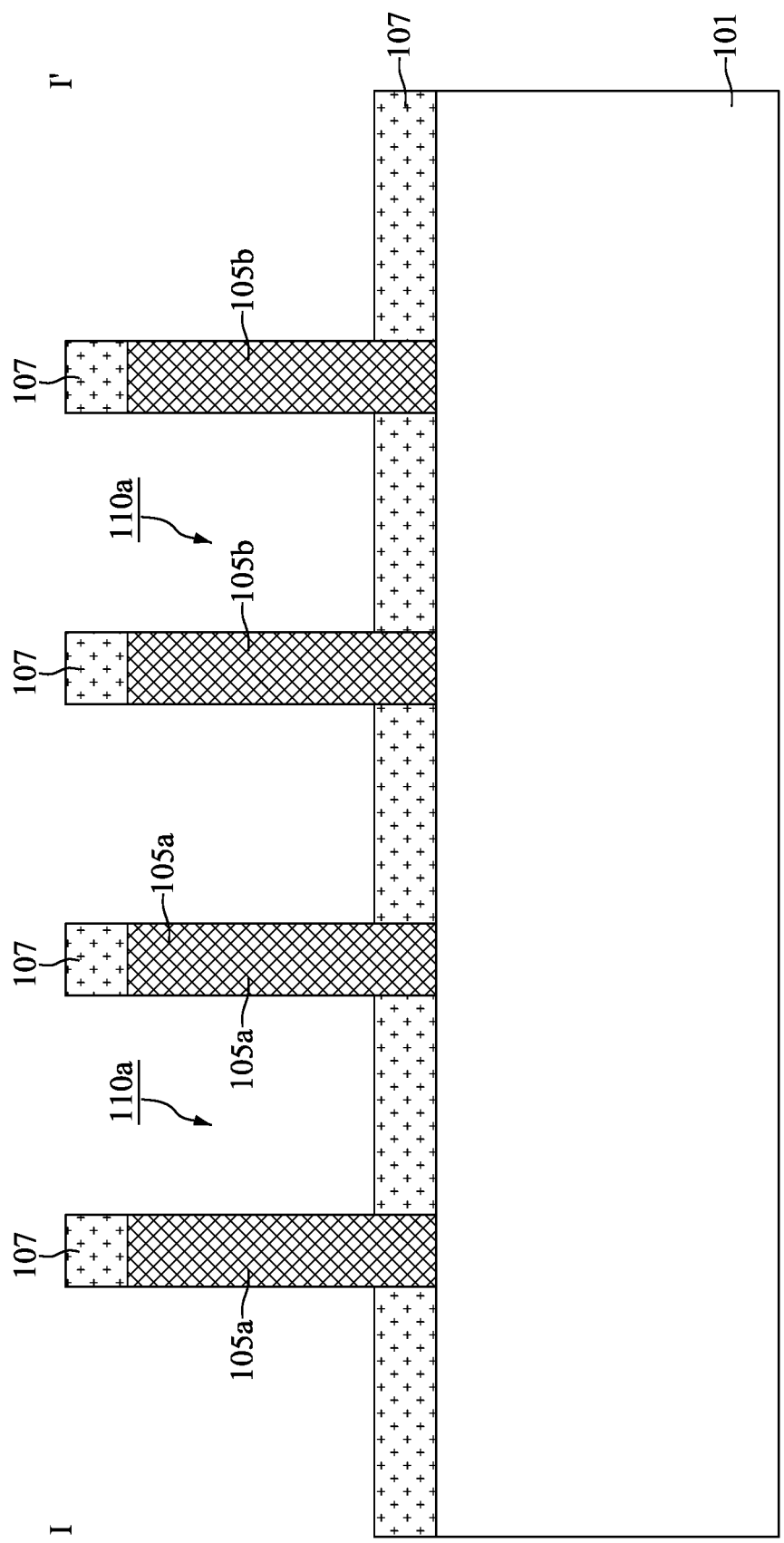
FIG. 6 is a cross-sectional view illustrating an intermediate stage of forming a mask material during the formation of the vertical e-fuse device along the sectional line I-I' in FIG. 5, in accordance with some embodiments.

Then, the cylindrical structure 103a and 103b are removed to form openings 110a and 110b within the ring structures 105a and 105b, and a mask material 107 is formed over the semiconductor substrate 101 and the ring structures 105a and 105b, as shown in FIGS. 5 and 6 in accordance with some embodiments. The respective step is illustrated as the step S13 in the method 10 shown in FIG. 2.

In some embodiments, the cylindrical structures 103a and 103b are removed by an etching process, such as a dry etching process. As described previously, the materials of the cylindrical structures 103a and 103b are different from the materials of the ring structures 105a and 105b, and the materials are selected such that the etching selectivity of the cylindrical structures 103a and 103b with respect to the ring structures 105a and 105b is high. Therefore, the cylindrical structures 103a and 103b are removed by the etching process while the ring structures 105a and 105b may be substantially left, and the openings 110a and 110b exposing the semiconductor substrate 101 are obtained.

Some materials and processes used to form the mask material 107 are similar to, or the same as, those used to form the cylindrical structures 103a and 103b, and details thereof are not repeated herein. In some embodiments, the materials of the mask material 107 are different from the materials of the ring structures 105a and 105b. In some embodiments, the mask material 107 is formed by selectively growing or depositing a dielectric material over the top surfaces of the ring structures 105a and 105b, and over the portions of the semiconductor substrate 101 exposed by the ring structures 105a and 105b. In some embodiments, the sidewalls of the ring structures 105a and 105b are partially exposed. That is, portions of the sidewalls of the ring structures 105a and 105b are not covered by the mask material 107. In some embodiments, the mask material 107 is formed by an epitaxial (epi) process.

Figure 7:
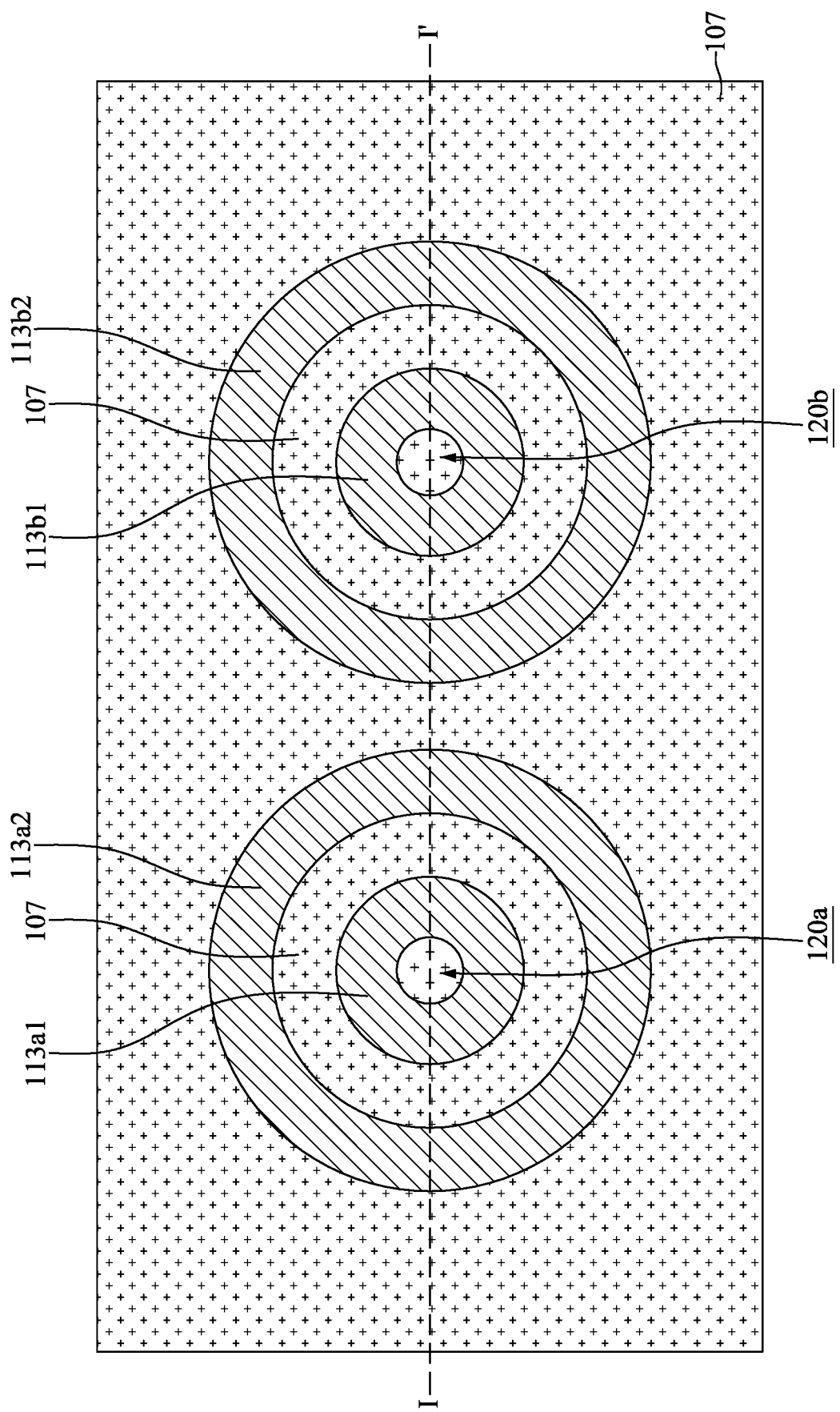
FIG. 7 is a top view illustrating an intermediate stage of depositing inner spacer layers and outer spacer layers during the formation of the vertical e-fuse device, in accordance with some embodiments.
Figure 8:
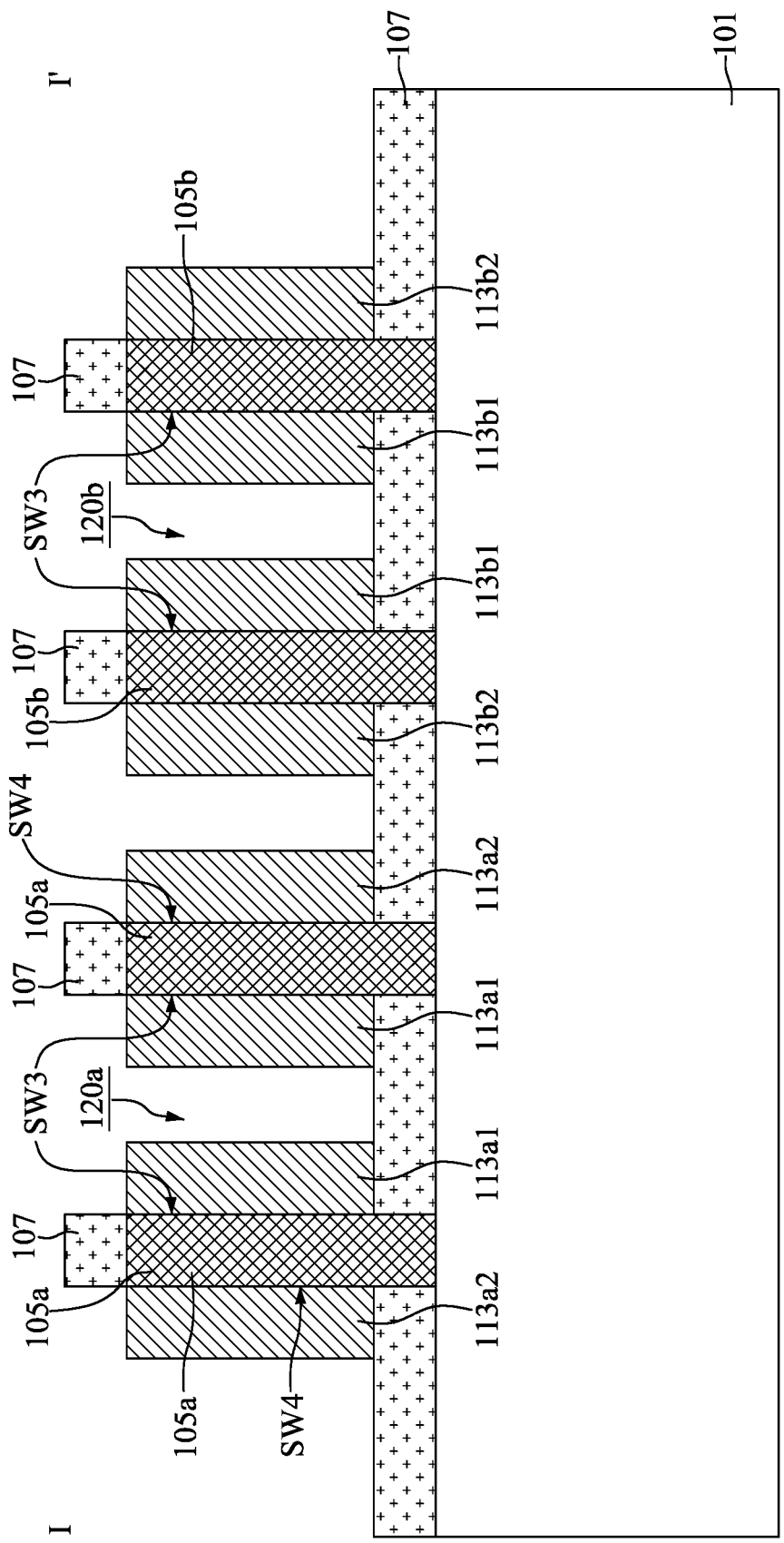
FIG. 8 is a cross-sectional view illustrating an intermediate stage of depositing inner spacer layers and outer spacer layers during the formation of the vertical e-fuse device along the sectional line I-I' in FIG. 7, in accordance with some embodiments.

Next, inner spacer layers 113a1, 113b1 and outer spacer layers 113a2, 113b2 are deposited over the mask material 107, as shown in FIGS. 7 and 8 in accordance with some embodiments. The respective step is illustrated as the step S15 in the method 10 shown in FIG. 2. In some embodiments, the inner spacer layers 113a1, 113b1 are deposited on and in direct contact with the inner sidewalls SW3 of the ring structures 105a and 105b, and the outer spacer layers 113a2, 113b2 are deposited on and in direct contact with the outer sidewalls SW4 of the ring structures 105a and 105b.

Moreover, an opening 120a is surrounded by the inner spacer layer 113a1, and another opening 120b is surrounded by the inner spacer layer 113b1. Some materials and processes used to form the inner spacer layers 113a1, 113b1 and the outer spacer layers 113a2, 113b2 are similar to, or the same as, those used to form the cylindrical structures 103a, 103b, and details thereof are not repeated herein. In some embodiments, the inner spacer layers 113a1, 113b1 and the outer spacer layers 113a2, 113b2 are simultaneously formed, and are made of the same material. However, it should be noted that the materials of the inner spacer layers 113a1, 113b1 and the outer spacer layers 113a2, 113b2 are different from the materials of the mask material 107 and the materials of the ring structures 105a, 105b, in accordance with some embodiments.

Figure 9:
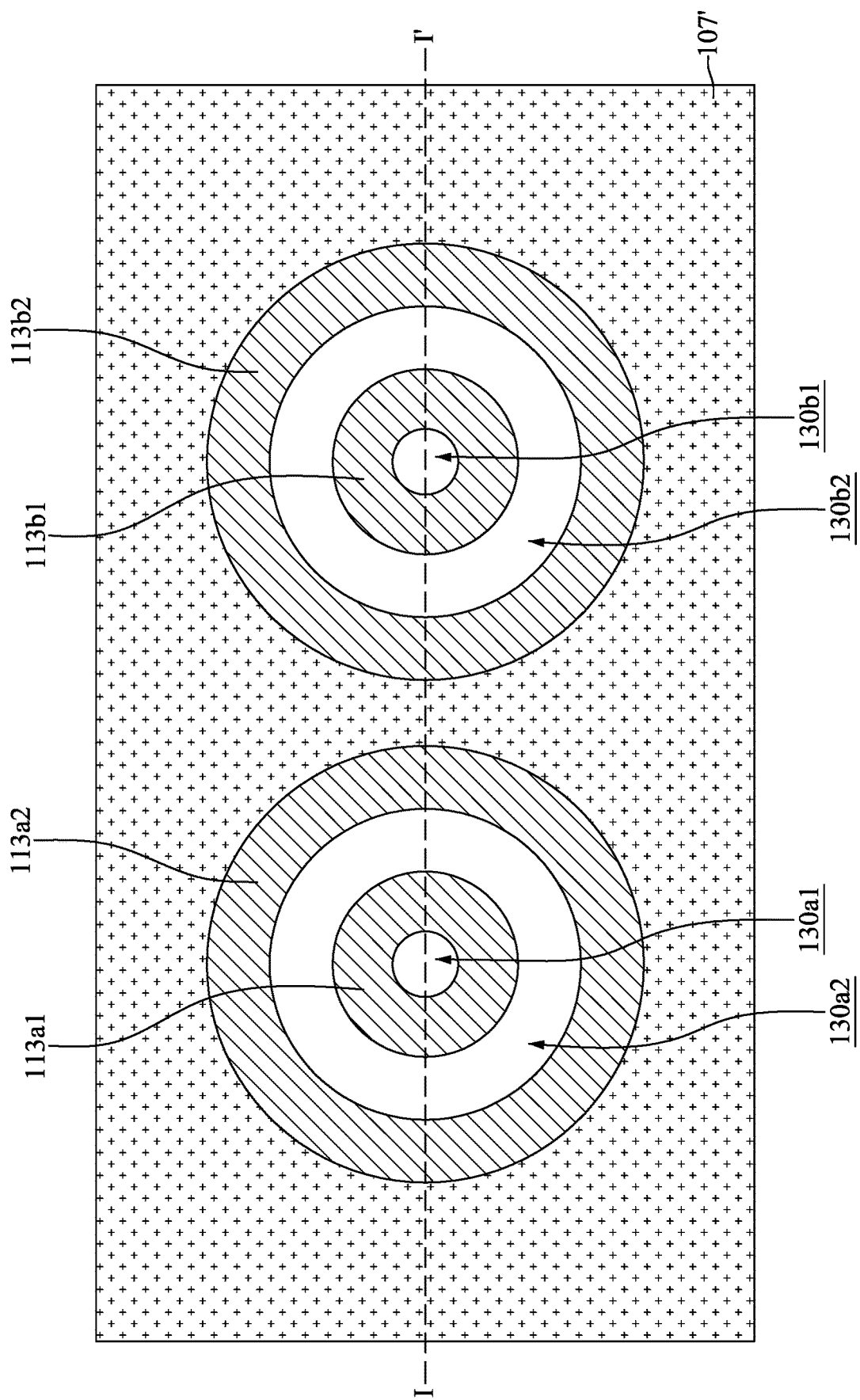
FIG. 9 is a top view illustrating an intermediate stage of forming fuse links over a semiconductor base during the formation of the vertical e-fuse device, in accordance with some embodiments.
Figure 10:
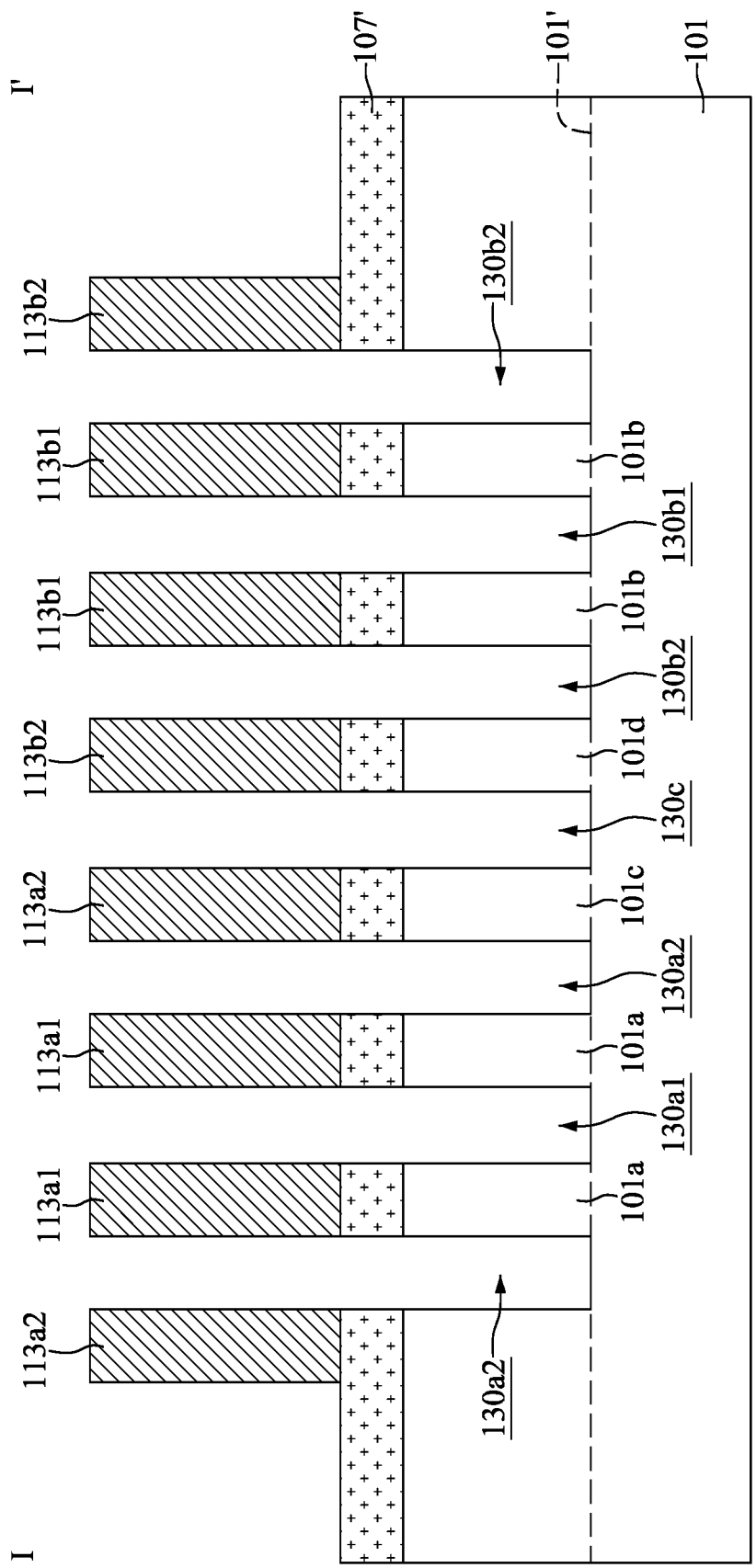
FIG. 10 is a cross-sectional view illustrating an intermediate stage of forming fuse links over a semiconductor base during the formation of the vertical e-fuse device along the sectional line I-I' in FIG. 9, in accordance with some embodiments.

Subsequently, the mask material 107 is etched by using the inner spacer layers 113a1, 113b1 and the outer spacer layers 113a2, 113b2 as a mask to form a mask layer 107' over the semiconductor substrate 101, and then, the semiconductor substrate 101 is etched by using the mask layer 107' as a mask to form fuse links 101a, 101b, 101c, 101d over a semiconductor base 101', as shown in FIGS. 9 and 10 in accordance with some embodiments. The respective step is illustrated as the steps S17 and S19 in the method 10 shown in FIG. 2. Each of the etching processes may include a dry etching process, a wet etching process, or a combination thereof.

It should be noted that the ring structures 105a, 105b and the portions of the mask material 107 exposed (i.e., not covered) by the inner spacer layers 113a1, 113b1 and the outer spacer layers 113a2, 113b2 are removed. In some embodiments, the materials of the ring structures 105a, 105b, the mask material 107, the inner spacer layers 113a1, 113b1 and the outer spacer layers 113a2, 113b2 are selected such that the etching selectivities of the mask material 107 and the ring structures 105a, 105b with respect to the inner spacer layers 113a1, 113b1 and the outer spacer layers 113a2, 113b2 are high. As a result, the ring structures 105a, 105b and the exposed portions of the mask material 107 are removed by the etching process while the inner spacer layers 113a1, 113b1 and the outer spacer layers 113a2, 113b2 may be substantially left.

Still referring to FIGS. 9 and 10, recesses 130a1, 130a2, 130b1, 130b2, and 130c are formed in the semiconductor substrate 101 and over the semiconductor base 101'. In some embodiments, the recess 130a1 is surrounded by the fuse link 101a, and the fuse link 101a is surrounded by the recess 130a2. In some embodiments, the recess 130b1 is surrounded by the fuse link 101b, and the fuse link 101b is surrounded by the recess 130b2. Moreover, the opening 130c is formed between the fuse links 101c and 101d, in accordance with some embodiments.

It should be noted that the fuse links 101a, 101b, 101c and 101d are formed from the semiconductor substrate 101. Therefore, the materials of the fuse links 101a, 101b, 101c and 101d and the materials of the semiconductor substrate 101 (i.e., the materials of the semiconductor base 101') are the same. In addition, the mask layer 107' is formed from the mask material 107. In some embodiments, some portions of the mask material 107 and the semiconductor substrate 101 in the peripheral regions of the outer spacer layers 113a2 and 113b2 are not etched.

Figure 11:
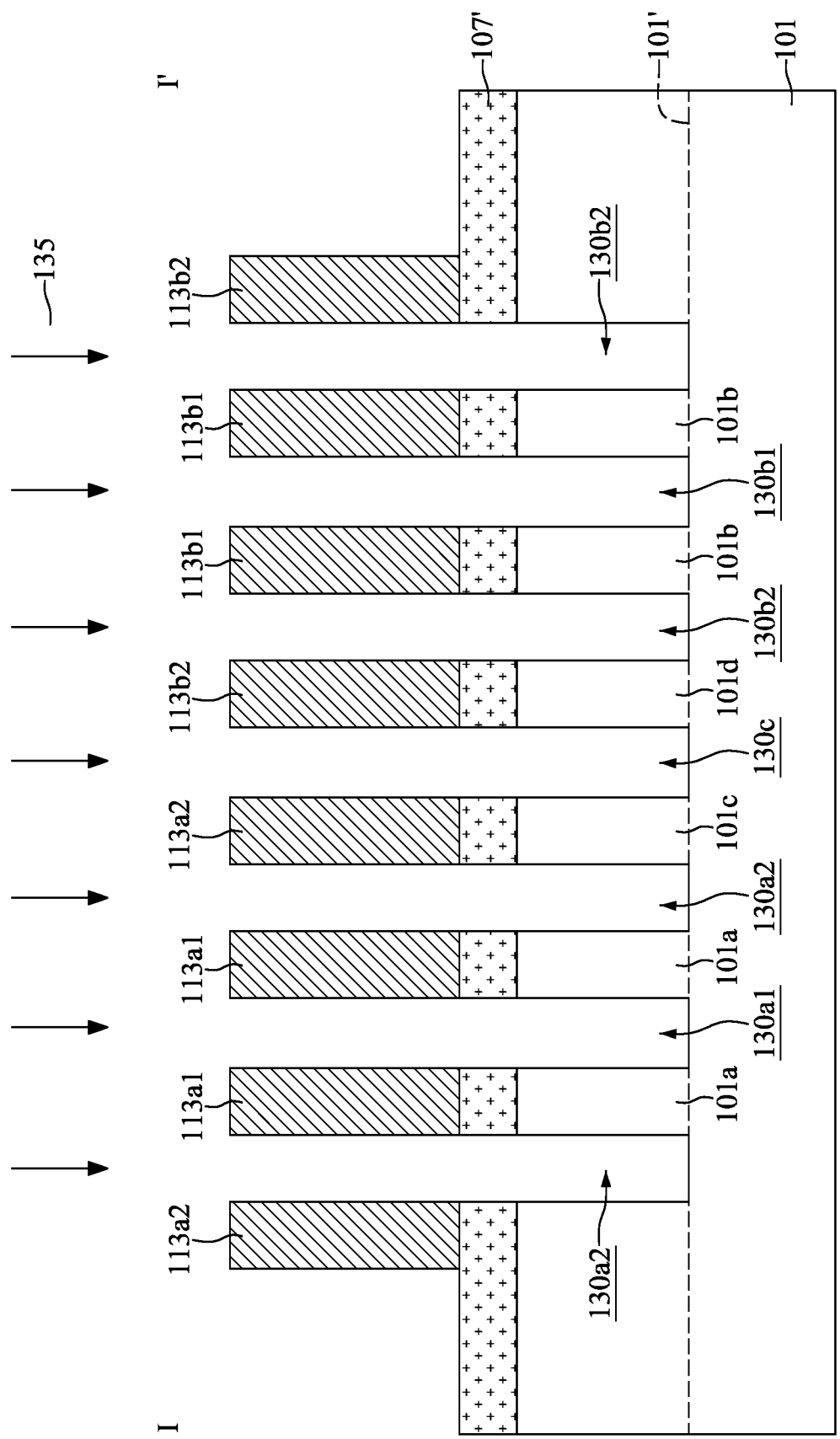
FIG. 11 is a cross-sectional view illustrating an intermediate stage of implanting the fuse links during the formation of the vertical e-fuse device, in accordance with some embodiments.

After the recesses 130a1, 130a2, 130b1, 130b2, and 130c are formed, an ion implantation process 135 is performed to implant dopants into the fuse links 101a, 101b, 101c and 101d through the recesses 130a1, 130a2, 130b1, 130b2, and 130c, as shown in FIG. 11 in accordance with some embodiments. The respective step is illustrated as the step S21 in the method 10 shown in FIG. 2. In some embodiments, N-type dopants, such as phosphorous (P) or arsenic (As) are implanted into the fuse links 101, 101b, 101c and 101d. In some other embodiments, P-type dopants, such as boron (B), gallium (Ga), or indium (In) are implanted into the fuse links 101a, 101b, 101c and 101d. The conductivity type of the fuse links 101, 101b, 101c and 101d depends on design requirements of the vertical e-fuse device 100.

Figure 12:
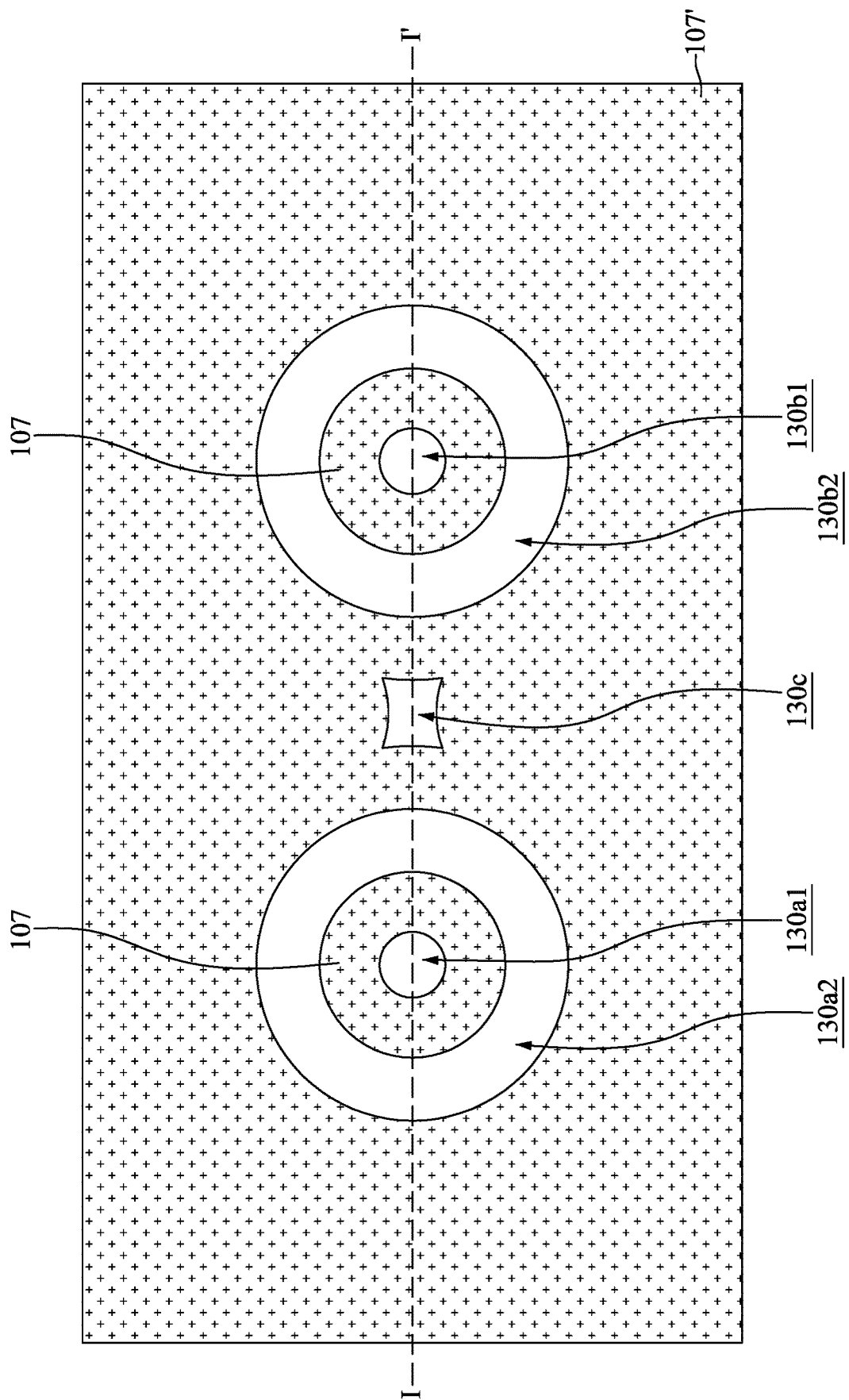
FIG. 12 is a top view illustrating an intermediate stage of removing the inner spacer layers and the outer spacer layers during the formation of the vertical e-fuse device, in accordance with some embodiments.
Figure 13:
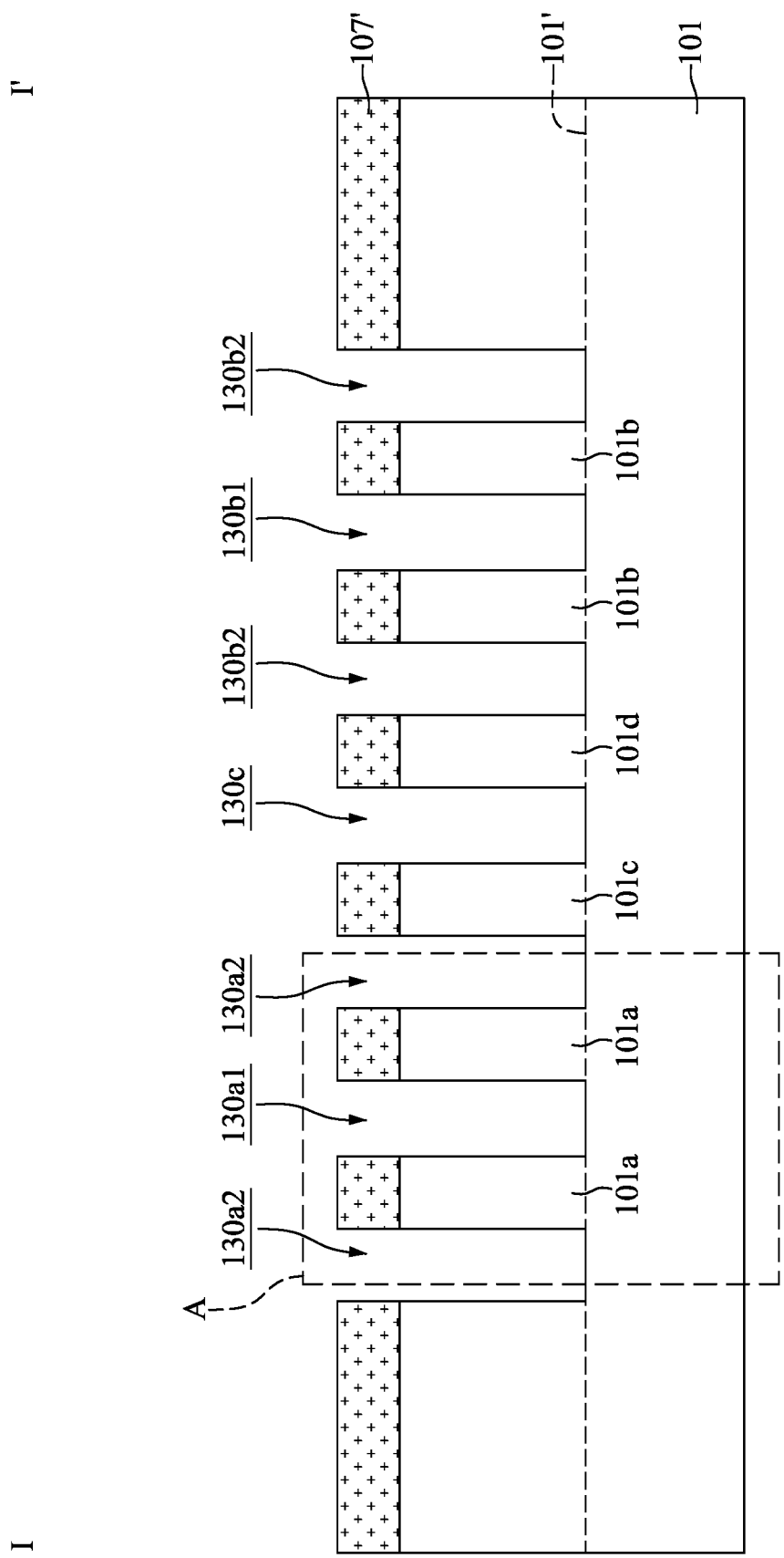
FIG. 13 is a cross-sectional view illustrating an intermediate stage of removing the inner spacer layers and the outer spacer layers during the formation of the vertical e-fuse device along the sectional line I-I' in FIG. 12, in accordance with some embodiments.

After the ion implantation process 135 is performed, the inner spacer layers 113a1, 113b1 and the outer spacer layers 113a2, 113b2 are removed, as shown in FIGS. 12 and 13 in accordance with some embodiments. In some embodiments, the inner spacer layers 113a1, 113b1 and the outer spacer layers 113a2, 113b2 are removed by an etching process. The etching process may be a wet etching process, a dry etching process, or a combination thereof.

FIGS. 14 to 21 are partial enlarged cross-sectional views of the region A in FIG. 13, which illustrate sequential intermediate stages of forming the vertical e-fuse device 100, in accordance with some embodiments. Although FIGS. 14 to 21 only illustrate a portion of the structure in FIGS. 12 and 13, it is understood that this is for ease of illustration, and the other portion of the structure in FIGS. 12 and 13 may have similar features as the features illustrated in FIGS. 14 to 21.

Figure 14:
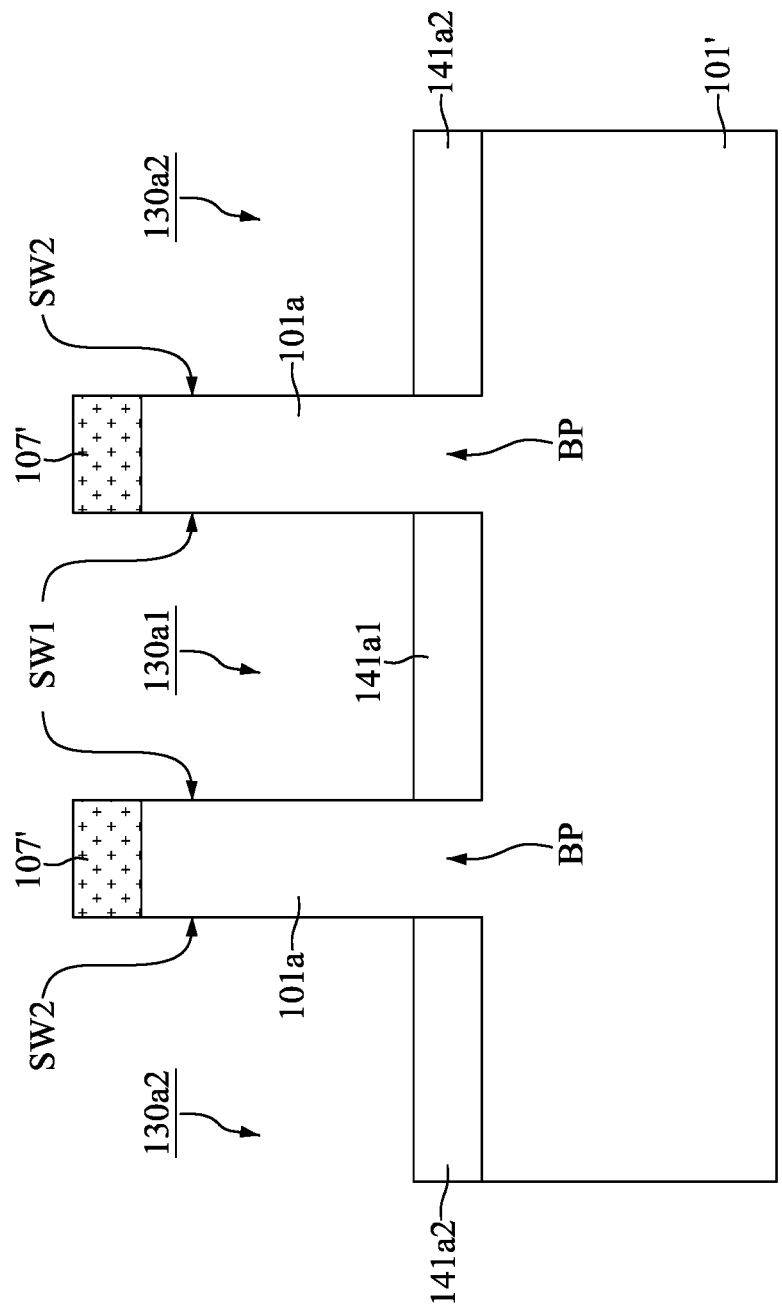
FIG. 14 is a partial enlarged cross-sectional view of the region A in FIG. 13.

After the inner spacer layers 113a1, 113b1 and the outer spacer layers 113a2, 113b2 are removed, bottom anode/cathode regions 141a1 and 141a2 are epitaxially grown over the semiconductor base 101' and adjacent to the fuse link 101a, as shown in FIG. 14 in accordance with some embodiments. The respective step is illustrated as the step S23 in the method 10 shown in FIG. 2. In some embodiments, the bottom anode/cathode regions 141a1 and 141a2 are epitaxially grown in the recesses 130a1 and 130a2, respectively.

As mentioned above, the two segments of the bottom anode/cathode region 141a2 shown in FIG. 14 are two different parts of a continuous annular structure. In some embodiments, the bottom anode/cathode region 141a1 is surrounded by the bottom portion BP of the fuse link 101a, and the bottom portion BP of the fuse link 101a is surrounded by the bottom anode/cathode region 141a2. In some embodiments, the bottom anode/cathode regions 141a1 and 141a2 are in direct contact with opposite sidewalls SW1 and SW2 (i.e., the inner sidewall SW1 and the outer sidewall SW2) of the fuse link 101a.

In some embodiments, a strained material is grown in the recesses 130a1 and 130a2 over the semiconductor base 101' by an epitaxial process to form the bottom anode/cathode regions 141a1 and 141a2. In some embodiments, the bottom anode/cathode regions 141a1 and 141a2 include Ge, SiGe, InAs, InGaAs, InSb, GaAs, GaSb, InAlP, InP, or the like. The epitaxial process may include a rapid thermal chemical vapor deposition (RTCVD) process, an ultra-high vacuum chemical vapor deposition (UHVCVD) process, a molecular beam epitaxy (MBE) process, a metal organic chemical vapor deposition (MOCVD) process, or another applicable process.

Figure 15:
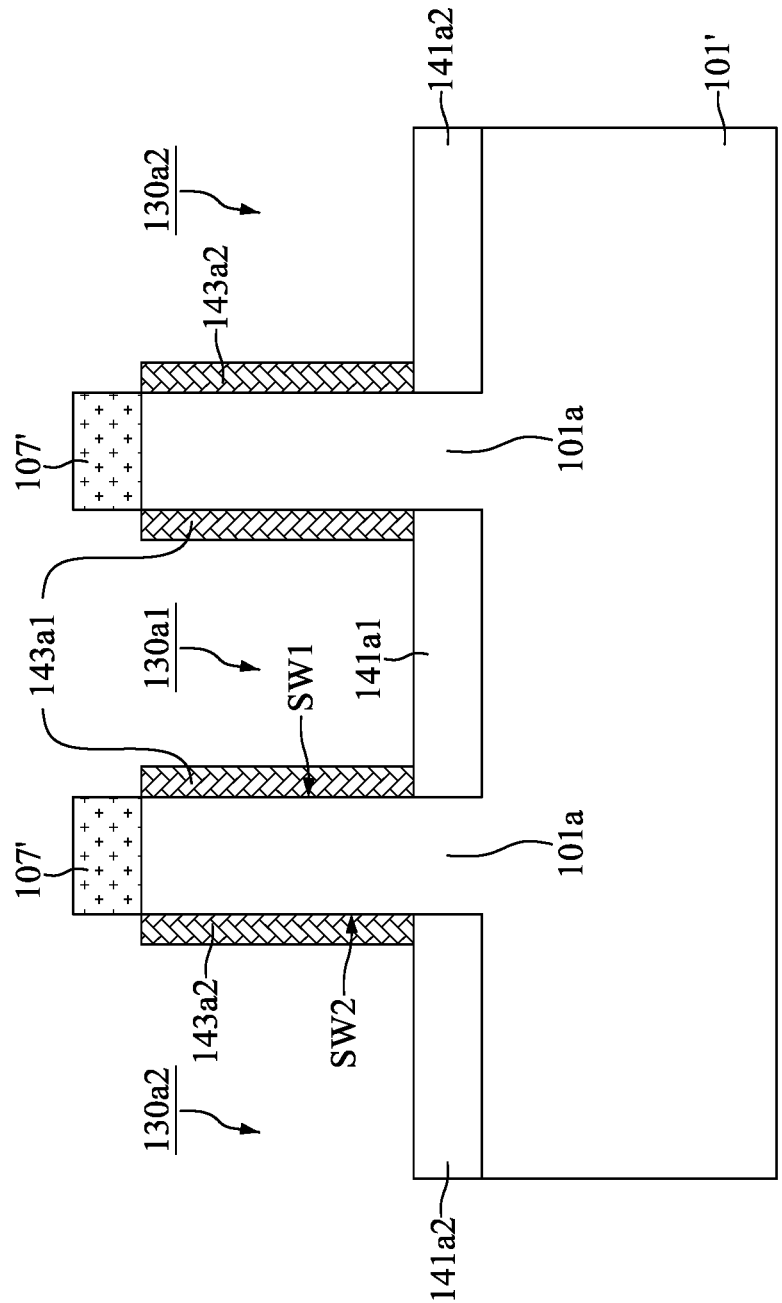
FIG. 15 is a partial enlarged cross-sectional view of the region A in FIG. 13.

Next, another inner spacer layer 143a1 is formed on and in direct contact with the sidewall SW1 of the fuse link 101a, and another outer spacer layer 143a2 is formed on and in direct contact with the sidewall SW2 of the fuse link 101a, as shown in FIG. 15 in accordance with some embodiments. In some embodiments, the inner spacer layer 143a1 is formed over the bottom anode/cathode region 141a1, and the outer spacer layer 143a2 is formed over the bottom anode/cathode region 141a2. After the inner spacer layer 143a1 and the outer spacer layer 143a2 are formed, the sidewalls SW1 and SW2 of the fuse link 101a are entirely covered.

In some embodiments, the inner spacer layer 143a1 and the outer spacer layer 143a2 are made of dielectric materials, such as silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. In some embodiments, the materials of the inner spacer layer 143a1 and the outer spacer layer 143a2 are different from the materials of the mask layer 107'. Moreover, the inner spacer layer 143a1 and the outer spacer layer 143a2 may be formed by a CVD process, a PVD process, an ALD process, another applicable process, or a combination thereof.

Figure 16:
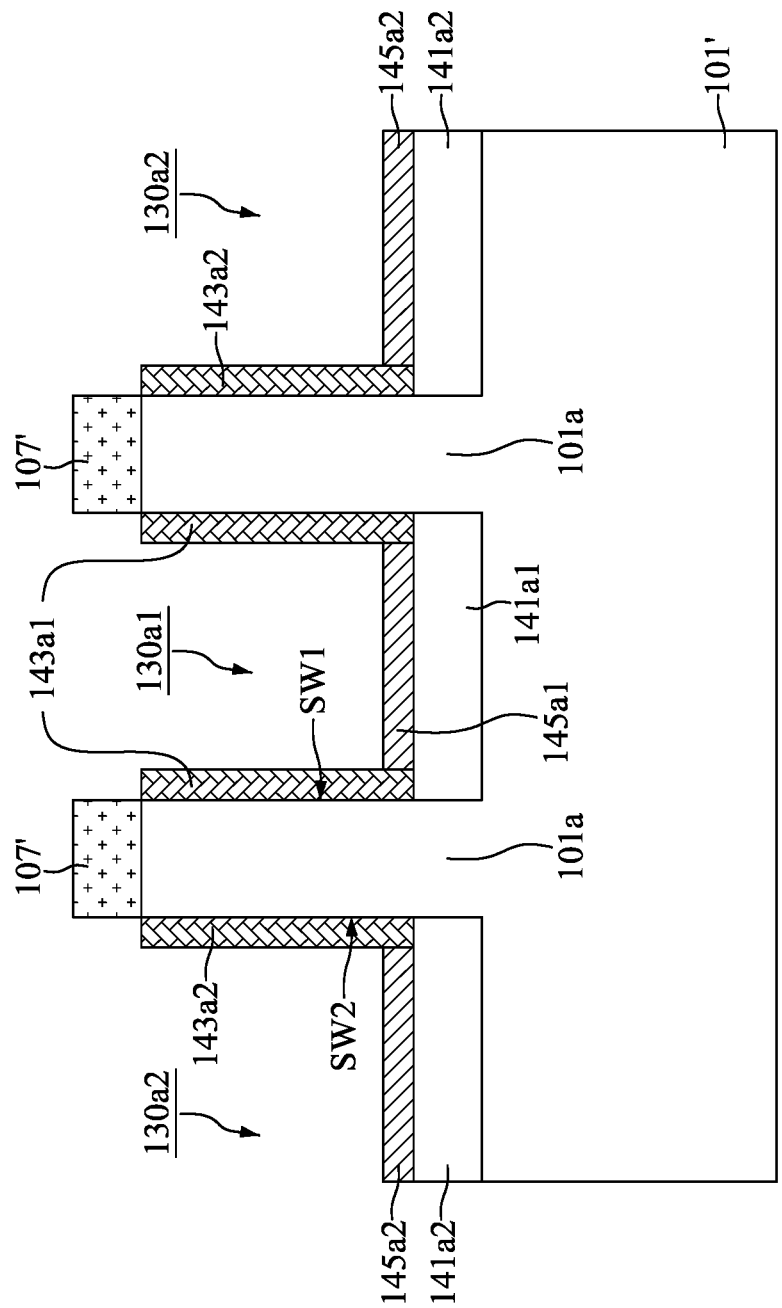
FIG. 16 is a partial enlarged cross-sectional view of the region A in FIG. 13.

After the inner spacer layer 143a1 and the outer spacer layer 143a2 are formed, silicide layers 145a1 and 145a2 are formed over the bottom anode/cathode regions 141a1 and 141a2, respectively, as shown in FIG. 16 in accordance with some embodiments. The respective step is illustrated as the step S25 in the method 10 shown in FIG. 2. In some embodiments, the silicide layer 145a1 is in direct contact with the inner spacer layer 143a1, and the silicide layer 145a2 is in direct contact with the outer spacer layer 143a2.

In some embodiments, the silicide layers 145a1 and 145a2 are made of a metal silicide material, such as cobalt silicide, titanium silicide, tantalum silicide, nickel silicide, copper silicide, tungsten silicide, molybdenum silicide, or another applicable material. Moreover, the silicide layers 145a1 and 145a2 may be formed by a silicidation process. In some embodiments, the silicidation process includes a metal material deposition process and an annealing process performed in sequence. In some embodiments, the deposition process of the silicidation process includes a PVD process, an ALD process, or another applicable process. In some embodiments, the annealing process of the silicidation process is performed at a temperature in a range from about 400° C. to about 700° C. After the annealing process, the unreacted metal material is removed.

Figure 17:
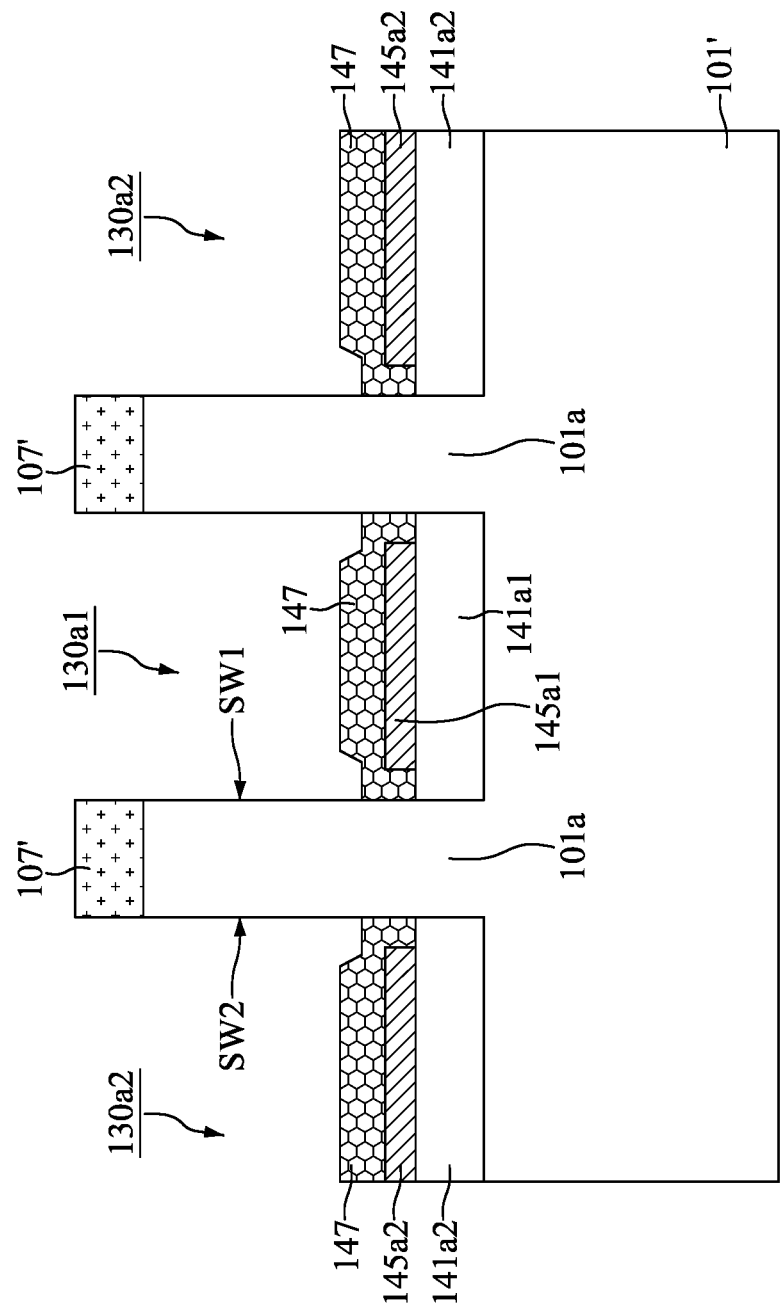
FIG. 17 is a partial enlarged cross-sectional view of the region A in FIG. 13, an intermediate stage of forming a bottom spacer layer over the silicide layers during the formation of the vertical e-fuse device, in accordance with some embodiments.

Then, the inner spacer layer 143a1 and the outer spacer layer 143a2 are removed, and a bottom spacer layer 147 is formed to cover the silicide layers 145a1 and 145a2, as shown in FIG. 17 in accordance with some embodiments. The respective step is illustrated as the step S27 in the method 10 shown in FIG. 2. In some embodiments, the bottom spacer layer 147 is in direct contact with the sidewalls SW1 and SW2 of the fuse link 101a.

In some embodiments, the inner spacer layer 143a1 and the outer spacer layer 143a2 are removed by a selective etching process, such as a reactive-ion etching (RIE) process. The removal of the inner spacer layer 143a1 and the outer spacer layer 143a2 exposes the sidewalls SW1 and SW2 of the fuse link 101a, and annular gaps (not shown) are formed between the silicide layer 145a1 and the fuse link 101a, and between the silicide layer 145a2 and the fuse link 101a. Then, the bottom spacer layer 147 is deposited over the silicide layers 145a1 and 145a2, and portions of the bottom spacer layer 147 extend into the annular gaps. As a result, the portions of the bottom spacer layer 147 are sandwiched between the silicide layers 145a1, 145a2 and the fuse link 101. In some embodiments, the silicide layers 145a1, 145a2 are separated from the sidewalls SW1 and SW2 of the fuse link 101 by the bottom spacer layer 147.

In some embodiments, the bottom spacer layer 147 is made of a dielectric material, such as silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. In addition, the bottom spacer layer 147 is formed by a directional deposition process, such as a high density plasma (HDP) deposition process, a gas cluster ion beam (GCIB) deposition process, or another applicable deposition process. The directional deposition process deposits the material of the bottom spacer layer 147 preferably on the exposed horizontal surfaces, but not on the lateral sidewalls. The material of the bottom spacer layer 147 formed over the top surfaces of the mask layer 107' will later be removed during subsequent planarization process, such as a chemical mechanical polishing (CMP) process.

Figure 18:
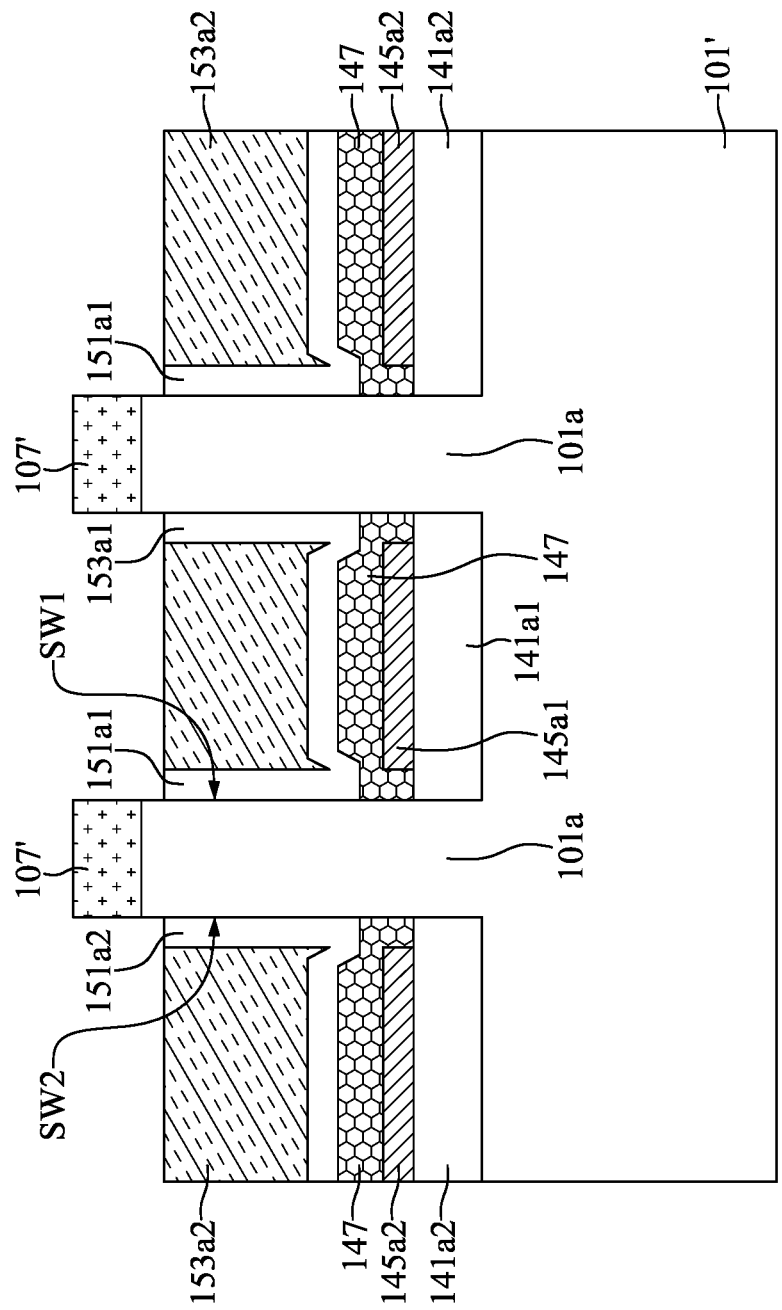
FIG. 18 is a partial enlarged cross-sectional view of the region A in FIG. 13.

Subsequently, fuse dielectric layers 151a1, 151a2 are formed over the bottom spacer layer 147, and conductive layers 153a1, 153a2 are formed over the fuse dielectric layers 151a1, 151a2, as shown in FIG. 18 in accordance with some embodiments. The respective step is illustrated as the step S29 in the method 10 shown in FIG. 2. In some embodiments, portions of the fuse dielectric layers 151a1 and 151a2 extend onto the sidewalls SW1 and SW2 of the fuse link 101a, and the conductive layers 153a1 and 153a2 are separated from the sidewalls SW1 and SW2 of the fuse link 101a by the fuse dielectric layers 151a1 and 151a2.

Each of the fuse dielectric layers 151a1 and 151a2 may be a single layer or multiple layers. In some embodiments, the fuse dielectric layers 151a1 and 151a2 are made of silicon oxide, silicon nitride, silicon oxynitride (SiON), dielectric material(s) with high dielectric constant (high-k), or a combination thereof. In some embodiments, the fuse dielectric layers 151a1 and 151a2 are deposited by a CVD process, a PVD process, an ALD process, a plasma enhanced chemical vapor deposition (PECVD) process, a spin-on coating process, or another applicable process.

Moreover, the conductive layers 153a1 and 153a2 are made of a conductive material such as aluminum (Al), copper (Cu), tungsten (W), titanium (Ti), tantalum (Ta), or another applicable material, in accordance with some embodiments. The conductive layers 153a1 and 153a2 may be formed by a deposition process, such as a CVD process, a PVD process, an ALD process, a high density plasma CVD (HDPCVD) process, an MOCVD process, or a PECVD process.

After the materials of the fuse dielectric layers 151a1, 151a2 and the conductive layers 153a1, 153a2 are deposited, excessive materials of the fuse dielectric layers 151a1, 151a2 and the conductive layers 153a1, 153a2 are removed by a single etching process or multiple etching processes, such as dry etching processes. As a result, the top surfaces of the fuse dielectric layers 151a1, 151a2 and the top surfaces of the conductive layers 153a1, 153a2 are lower than the top surface of the mask layer 107'. In some embodiments, the top surfaces of the fuse dielectric layers 151a1, 151a2 and the conductive layers 153a1, 153a2 are lower than the top surface of the fuse link 101a, such that the sidewalls SW1 and SW2 of the fuse link 101a are partially exposed.

Figure 19:
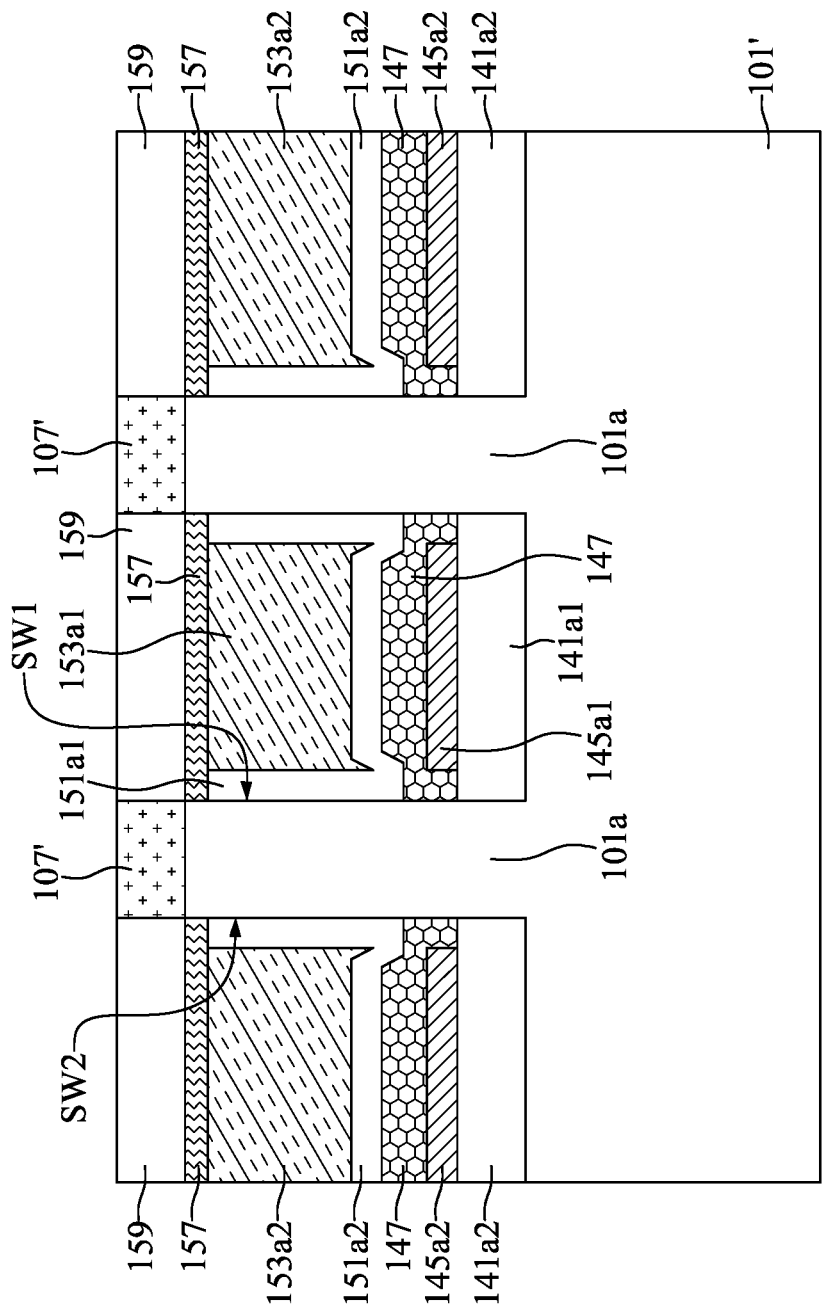
FIG. 19 is a partial enlarged cross-sectional view of the region A in FIG. 13.

Next, a top spacer layer 157 is formed to cover the fuse dielectric layers 151a1, 151a2 and the conductive layers 153a1, 153a2, and an ILD layer 159 is formed over the top spacer layer 157, as shown in FIG. 19 in accordance with some embodiments. The respective step is illustrated as the step S31 in the method 10 shown in FIG. 2. In some embodiments, the top spacer layer 157 is in direct contact with the top portions of the sidewalls SW1 and SW2 of the fuse link 101a. Some materials and processes used to form the top spacer layer 157 are similar to, or the same as, those used to form the bottom spacer layer 147, and details thereof are not repeated herein.

The ILD layer 159 may be a single layer or multiple layers. In some embodiments, the materials of the ILD layer 159 include silicon oxide, silicon nitride, silicon oxynitride, tetraethoxysilane (TEOS) oxide, phosphosilicate glass (PSG), borophosphosilicate glass (BPSG), low-k dielectric material, or another applicable dielectric material. The ILD layer 159 may be formed by a CVD process, a PVD process, an ALD process, a spin-on coating process, or another applicable process. Afterwards, a planarization process, such as a CMP process, may be performed on the ILD layer 159 until the top surface of the mask layer 107' is exposed.

Figure 20:
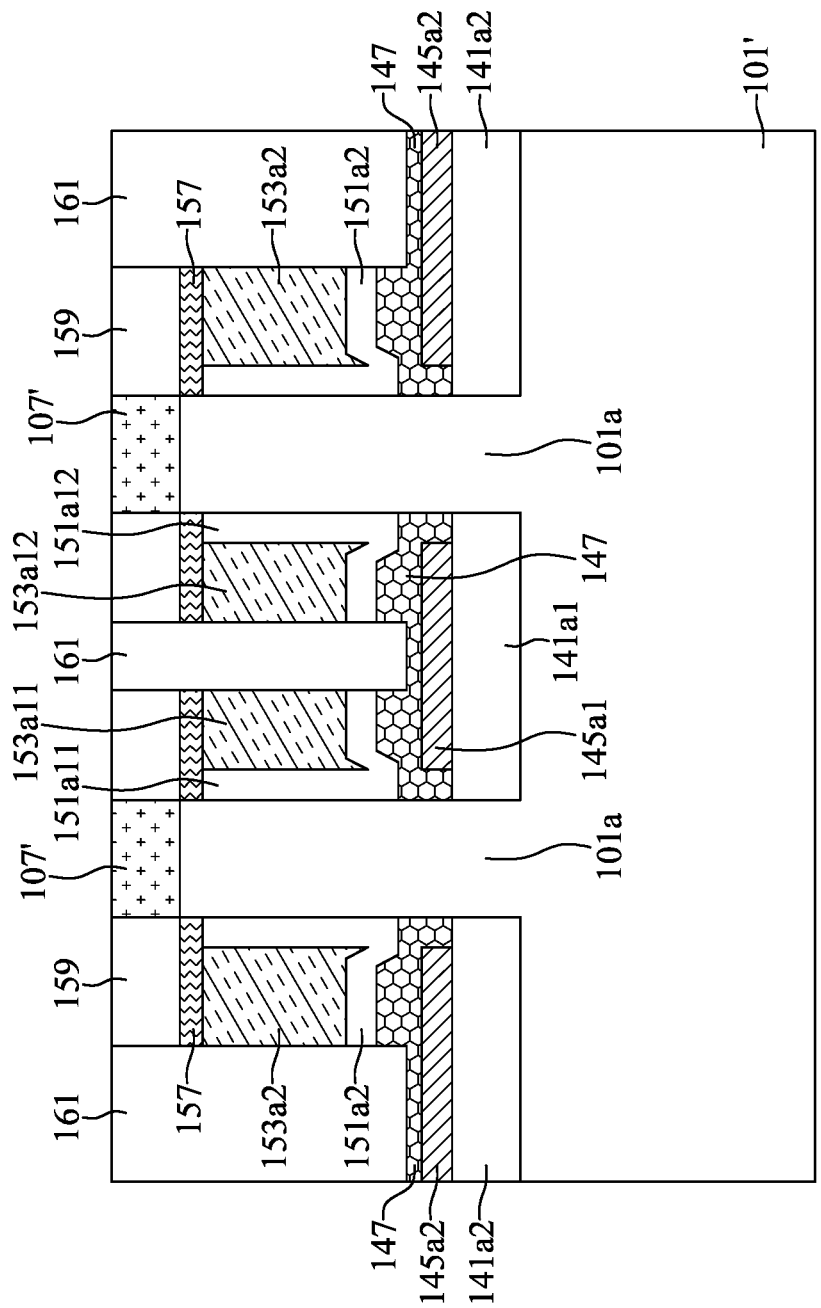
FIG. 20 is a partial enlarged cross-sectional view of the region A in FIG. 13.

A dielectric layer 161 is formed penetrating through the ILD layer 159, the top spacer layer 157, the conductive layers 153a1, 153a2, and the fuse dielectric layers 151a1, 151a2, as shown in FIG. 20 in accordance with some embodiments. The dielectric layer 161 may be made of silicon oxide, silicon nitride, silicon oxynitride or another applicable dielectric material, and the formation of the dielectric layer 161 may include forming a patterned mask (not shown) over the structure of FIG. 19, etching the ILD layer 159, the top spacer layer 157, the conductive layers 153a1, 153a2, and the fuse dielectric layers 151a1, 151a2 to form openings (not shown) by using the patterned mask as a mask, depositing a dielectric material in the openings and over the ILD layer 159 and the mask layer 107', and polishing the dielectric material until the top surface of the mask layer 107' is exposed.

In some embodiments, the bottom spacer layer 147 is partially etched during the etching process for forming the dielectric layer 161. As a result, the bottom surface of the dielectric layer 161 may be lower than the top surface of the bottom spacer layer 147. However, it should be noted that the dielectric layer 161 does not penetrate through the bottom spacer layer 147. That is, the dielectric layer 161 is separated from the silicide layers 145a1 and 145a2 by the bottom spacer layer 147. After the dielectric layer 161 is formed, the conductive layers 153a11, 153a12 and the fuse dielectric layers 151a11, 151a12 are obtained.

Figure 21:
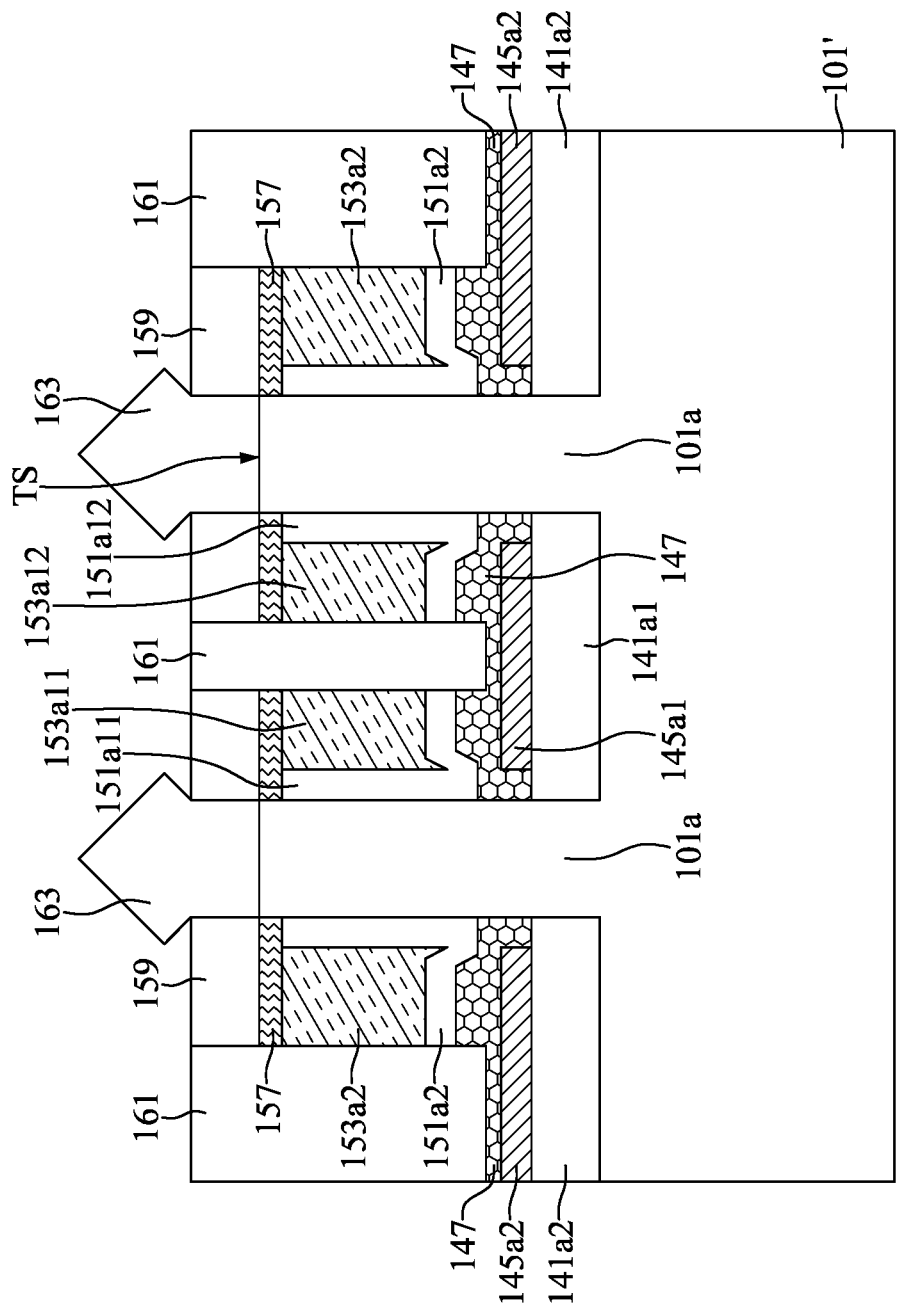
FIG. 21 is a partial enlarged cross-sectional view of the region A in FIG. 13.

After the ILD layer 161 is formed, a top anode/cathode region 163 is epitaxially grown to replace the mask layer 107', as shown in FIG. 21 in accordance with some embodiments. The respective step is illustrated as the step S33 in the method 10 shown in FIG. 2. More specifically, the mask layer 107' is removed, and the top anode/cathode region 163 is epitaxially grown over the top surface of the fuse link 101a, in accordance with some embodiments.

In some embodiments, the mask layer 107' is removed by an etching process, such as a wet etching process. After the mask layer 107' is removed, the top surface TS of the fuse link 101a and the sidewalls of the ILD layer 159 are exposed by an annular opening (not shown), and the top anode/cathode region 163 is epitaxially grown in the annular opening, in accordance with some embodiments. Some materials and processes used to form the top anode/cathode region 163 are similar to, or the same as, those used to form the bottom anode/cathode regions 141a1 and 141a2, and details thereof are not repeated herein.

In some embodiments, the top anode/cathode region 163 is doped in-situ with N-type or P-type dopants, during their epitaxial growth. In some other embodiments, the top anode/cathode region 163 is undoped during their epitaxial growth. Instead, after the growth of the top anode/cathode region 163, the top anode/cathode region 163 is doped in a subsequent process, such as an ion implantation process. In particular, since the top anode/cathode region 163 has slower growth rate on (111) oriented surface during their epitaxial growth, the anode/cathode region 163 includes faceted portions, as shown in FIG. 21 in accordance with some embodiments. In some embodiments, the top anode/cathode region 163 is in direct contact with the top surface TS of the fuse link 101a.

After the top anode/cathode region 163 is epitaxially grown, an ILD layer 165 is formed over the structure of FIG. 21, and a conductive contact is formed in the ILD layer 165 and over the top anode/cathode region 163, as shown in FIG. 1 in accordance with some embodiments. In some embodiments, the conductive contact 167 covers and in direct contact with the facet portions of the top anode/cathode region 163. Some materials and processes used to form the ILD layer 165 are similar to, or the same as, those used to form the ILD layer 159, and details thereof are not repeated herein.

In some embodiments, the conductive contact 167 is made of copper (Cu), copper alloy, aluminum (Al), aluminum alloy, tungsten (W), tungsten alloy, titanium (Ti), titanium alloy, tantalum (Ta), tantalum alloy, or a combination thereof. Alternatively, other applicable conductive materials may be used. Moreover, the formation of the conductive contact 167 may include forming a patterned mask (not shown) over the ILD layer 165, etching the ILD layer 165 to form an opening (not shown) partially exposing the top anode/cathode region 163 by using the patterned mask as a mask, depositing the material of the conductive contact 167 in the opening and over the ILD layer 165, and polishing the material of the conductive contact 167 until the top surface of the ILD layer 165 is exposed. After the conductive contact 167 is formed, the vertical e-fuse device 100 is obtained.

Embodiments of a vertical e-fuse device 100 are provided in the disclosure. Since the fuse link 101a of the vertical e-fuse device 100 is arranged in the vertical direction between the bottom anode/cathode regions 141a1, 141a2 and the top anode/cathode region 163, the vertical e-fuse device 100 can be integrated with other semiconductor devices, such as a FinFET device, and the vertical e-fuse device 100 can be integrally formed with the FinFET device without additional process steps.

In one embodiment of the present disclosure, a vertical e-fuse device is provided. The vertical e-fuse device includes a fuse link disposed over a semiconductor base. A material of the fuse link and a material of the semiconductor base are the same. The vertical e-fuse device also includes a first bottom anode/cathode region and a second bottom anode/cathode region disposed over the semiconductor base. A bottom portion of the fuse link is sandwiched between the first bottom anode/cathode region and the second anode/cathode region. The vertical e-fuse device further includes a top anode/cathode region disposed over the fuse link.

In another embodiment of the present disclosure, a vertical e-fuse device is provided. The vertical e-fuse device includes an annular fuse link disposed over a semiconductor base. A material of the annular fuse link and a material of the semiconductor base are the same. The vertical e-fuse device also includes a first bottom anode/cathode region surrounded by a bottom portion of the annular fuse link, and a second bottom anode/cathode region surrounding the bottom portion of the annular fuse link. The vertical e-fuse device further includes a top anode/cathode region disposed over the annular fuse link.

In yet another embodiment of the present disclosure, a method for preparing a vertical e-fuse device is provided. The method includes forming a mask layer over a semiconductor substrate, and etching the semiconductor substrate by using the mask layer as a mask to form a fuse link over a semiconductor base. The method also includes epitaxially growing a first bottom anode/cathode region and a second bottom anode/cathode region over the semiconductor base and adjacent to a bottom portion of the fuse link. The fuse link is between the first bottom anode/cathode region and the second anode/cathode region. The method further includes epitaxially growing a top anode/cathode region to replace the mask layer.

The embodiments of the present disclosure have some advantageous features. By forming the fuse link extending in the vertical direction between the bottom anode/cathode regions and the top anode/cathode region, the vertical e-fuse device can be integrated with other semiconductor devices, such as a FinFET device, and the vertical e-fuse device can be integrally formed with the FinFET device without additional process steps.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a vertical e-fuse device, comprising:
    forming a mask layer over a semiconductor substrate;
    etching the semiconductor substrate by using the mask layer as a mask to form a fuse link over a semiconductor base;
    epitaxially growing a first bottom anode/cathode region and a second bottom anode/cathode region over the semiconductor base and adjacent to a bottom portion of the fuse link, wherein the fuse link is between the first bottom anode/cathode region and the second anode/cathode region; and
    epitaxially growing a top anode/cathode region to replace the mask layer;
    wherein forming the mask layer further comprises:
    forming a ring structure over the semiconductor substrate;
    forming a mask material to cover a portion of the semiconductor substrate exposed by the ring structure;
    depositing an inner spacer layer and an outer spacer layer over the mask material, wherein an inner sidewall of the ring structure is covered by the inner spacer layer, and an outer sidewall of the ring structure is covered by the outer spacer layer; and
    etching the mask material by using the inner spacer layer and the outer spacer layer as a mask to form the mask layer over the semiconductor substrate.

2. The method for preparing a vertical e-fuse device of claim 1, wherein the mask layer and the fuse link have overlapped annular shapes from a top view.

3. The method for preparing a vertical e-fuse device of claim 1, further comprising:
    implanting the fuse link with an n-type dopant; and
    removing the inner spacer layer and the outer spacer layer after the implantation of the fuse link.

4. The method for preparing a vertical e-fuse device of claim 3, further comprising:
    forming a first fuse dielectric layer and a second fuse dielectric layer over the bottom spacer layer and on opposite sidewalls of the fuse link;
    forming a first conductive layer over the first fuse dielectric layer and a second conductive layer over the second fuse dielectric layer; and
    forming a top spacer layer to cover the first conductive layer and the second conductive layer before the top anode/cathode region is grown.

5. A method for preparing a vertical e-fuse device, comprising:
    forming a mask layer over a semiconductor substrate;
    etching the semiconductor substrate by using the mask layer as a mask to form a fuse link over a semiconductor base;
    epitaxially growing a first bottom anode/cathode region and a second bottom anode/cathode region over the semiconductor base and adjacent to a bottom portion of the fuse link, wherein the fuse link is between the first bottom anode/cathode region and the second anode/cathode region;
    epitaxially growing a top anode/cathode region to replace the mask layer;

forming a first silicide layer over the first bottom anode/cathode region and a second silicide layer over the second bottom anode/cathode region; and forming a bottom spacer layer to cover the first silicide layer and the second silicide layer before the top anode/cathode region is grown.

\* \* \* \* \*